US011730032B2

(12) United States Patent
Lee et al.

(10) Patent No.: US 11,730,032 B2
(45) Date of Patent: Aug. 15, 2023

(54) DISPLAY DEVICE HAVING OUTER SIGNAL LINE ADJACENT TO A SIDE SURFACE

(71) Applicant: Samsung Display Co., LTD., Yongin-si (KR)

(72) Inventors: Donghyun Lee, Ansan-si (KR); Seung-Soo Ryu, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 28 days.

(21) Appl. No.: 17/350,872

(22) Filed: Jun. 17, 2021

(65) Prior Publication Data

US 2022/0005917 A1    Jan. 6, 2022

(30) Foreign Application Priority Data

Jul. 3, 2020   (KR) .................. 10-2020-0082087

(51) Int. Cl.
*H10K 59/131*    (2023.01)
*H10K 59/40*     (2023.01)
(Continued)

(52) U.S. Cl.
CPC ......... *H10K 59/131* (2023.02); *H10K 59/126* (2023.02); *H10K 59/40* (2023.02); *H10K 59/88* (2023.02); *H10K 77/111* (2023.02); *G06F 3/0412* (2013.01); *G06F 3/04164* (2019.05); *H10K 2102/311* (2023.02)

(58) Field of Classification Search
None
See application file for complete search history.

(56) References Cited

U.S. PATENT DOCUMENTS 8,854,283 B2    10/2014  Yamamoto et al.
10,566,554 B2    2/2020  Li et al.
(Continued)

FOREIGN PATENT DOCUMENTS

JP              4697297 B2    6/2011
KR    10-2018-0058910 A    6/2018
(Continued)

OTHER PUBLICATIONS

Definition of adjacent downloaded from URL<https://www.merriam-webster.com/dictionary/adjacent> on Dec. 7, 2022; (Year: 2011).*

*Primary Examiner* — J. E. Schoenholtz
(74) *Attorney, Agent, or Firm* — Lewis Roca Rothgerber Christie LLP

(57) ABSTRACT

A display device includes: a base layer comprising a top surface, a bottom surface opposite the top surface, and a plurality of side surfaces connecting the top surface and the bottom surface, wherein a display area and a non-display area adjacent to the display area are defined; an outer line overlapping the non-display area, on the top surface, and adjacent to any one of the plurality of side surfaces; a light emitting element layer overlapping the display area, on the top surface, and comprising a light emitting element; and a connection line connecting the outer line and the light emitting element, wherein the outer line comprises a center line extending from the connection line in a first direction and a branch line extending from the center line in a second direction crossing the first direction.

19 Claims, 18 Drawing Sheets

(51) Int. Cl.
    *H10K 59/88*     (2023.01)
    *H10K 59/126*     (2023.01)
    *H10K 77/10*     (2023.01)
    *G06F 3/041*     (2006.01)
    *H10K 102/00*     (2023.01)

(56) References Cited

U.S. PATENT DOCUMENTS

| | | |
|---|---|---|
| 10,578,933 B2 | 3/2020 | Ye et al. |
| 2019/0049771 A1* | 2/2019 | Ye .................. H01L 27/1266 |
| 2020/0057323 A1 | 2/2020 | Son et al. |
| 2020/0303468 A1* | 9/2020 | In .................. H01L 27/3276 |
| 2021/0202532 A1* | 7/2021 | Kim .................. H01L 27/124 |

FOREIGN PATENT DOCUMENTS

| | | |
|---|---|---|
| KR | 10-2019-0018118 A | 2/2019 |
| KR | 10-2020-0021577 A | 3/2020 |

\* cited by examiner

DISPLAY DEVICE HAVING OUTER SIGNAL LINE ADJACENT TO A SIDE SURFACE

CROSS-REFERENCE TO RELATED APPLICATION

The present application claims priority to and the benefit of Korean Patent Application No. 10-2020-0082087, filed on Jul. 3, 2020, the entire content of which is hereby incorporated by reference.

BACKGROUND

1. Field

Aspects of some example embodiments of the present disclosure herein relate to a display device.

2. Description of the Related Art

The manufacturing procedure of a display device may include a process for electrically connecting a display panel and a driving chip. Such a connection process may include a Chip on Glass (COG), Chip on Film (COF), or Chip on PI (COP) mounting scheme according to a driving chip mounting scheme.

The COG, COF, and COP mounting scheme is a scheme for directly mounting a driving chip on a non-display area of the display panel to deliver an electrical signal to the display panel, and the driving chip is typically bonded to the display panel using an Anisotropic Conductive Film (ACF).

In order to extend a display area of a display device on which an image is displayed, the structure in which a circuit chip is located on a side surface of the display panel is being studied.

The above information disclosed in this Background section is only for enhancement of understanding of the background and therefore the information discussed in this Background section does not necessarily constitute prior art.

SUMMARY

Aspects of some example embodiments of the present disclosure herein relate to a display device, and for example, to a display device in which the reliability of a signal line is enhanced.

Aspects of some example embodiments of the present disclosure include a display device in which the reliability of a signal line may be enhanced.

According to some example embodiments of the inventive concept, a display device includes: a base layer including a top surface, a bottom surface opposite to the top surface, and a plurality of side surfaces connecting the top surface and the bottom surface, wherein a display area and a non-display area adjacent to the display area are defined; an outer line overlapping the non-display area, on the top surface, and adjacent to any one of the plurality of side surfaces; a light emitting element layer overlapping the display area, on the top surface, and including a light emitting element; and a connection line connecting the outer line and the light emitting element, wherein the outer line includes a center line extending from the connection line in a first direction and a branch line extending from the center line in a second direction crossing the first direction.

According to some example embodiments, the outer line may be provided in plural, and a dummy pattern between the plurality of center lines may be further included.

According to some example embodiments, the dummy pattern may overlap at least a portion of the outer line.

According to some example embodiments, the connection line may overlap at least one of the outer line or the dummy pattern.

According to some example embodiments, a shape of the dummy pattern may include at least one of a circle or a polygon.

According to some example embodiments, the display device may further include: an electrostatic discharge circuit on the base layer, wherein the electrostatic discharge circuit overlaps at least one of the outer line or the dummy pattern in the first direction.

According to some example embodiments, the outer line may include neighboring first and second outer lines, wherein the first outer line includes a first center line and a first branch line, and the second outer line includes a second center line and a second branch line, wherein the first branch line and the second branch line overlap each other in the first direction.

According to some example embodiments, the display device may further include a plurality of pads on any one of the plurality of side surfaces and configured to contact the outer line.

According to some example embodiments, the display device may further include a circuit board electrically connected to the plurality of pads.

According to some example embodiments, the circuit board may be a flexible circuit board.

According to some example embodiments, a shape of the branch line may include at least one of a circle or a polygon.

According to some example embodiments, the display device may further include a first insulation layer, a first conductive layer, a second insulation layer, a second conductive layer, a third insulation layer, a third conductive layer, and a fourth insulation layer sequentially laminated on the base layer.

According to some example embodiments, the display device may further include: a transistor on the base layer and electrically connected to the light emitting element; and a connection electrode electrically connected to the transistor, wherein the transistor includes a source, a drain, and an active channel under the first insulation layer, and a gate between the first insulation layer and the second insulation layer, and the connection electrode is between any two contacting insulation layers among the first insulation layer, the second insulation layer, the third insulation layer, and the fourth insulation layer.

According to some example embodiments, the outer line may include at least one of the first conductive layer, the second conductive layer, or the third conductive layer.

According to some example embodiments, the outer line may include one or a plurality of layers.

According to some example embodiments, the top surface of the base layer may include a long side and a short side, and the outer line may be adjacent to the long side or the short side.

According to some example embodiments, a width of the center line may be greater than that of the connection line.

According to some example embodiments, the base layer may include a flexible material.

According to some example embodiments of the inventive concept, a display device includes: a display panel including a base layer, a circuit layer, and a light emitting element layer sequentially laminated; and a plurality of pads on a side surface of the display panel, wherein the circuit layer includes an outer line on the base layer, a connection line connecting the outer line and the light emitting element layer, and an electrostatic discharge circuit on the base layer, wherein the outer line is closer to the side surface than the electrostatic discharge circuit, entire surfaces of the connection line and the electrostatic discharge circuit overlap the outer line, and the outer line contacts the plurality of pads.

According to some example embodiments, the outer line may further include: a center line extending from the connection line in a first direction; and at least one of a branch line extending from the center line in a second direction crossing the first direction or a dummy pattern adjacent to the center line.

BRIEF DESCRIPTION OF THE DRAWINGS

The accompanying drawings are included to provide a further understanding of embodiments according to the inventive concept, and are incorporated in and constitute a part of this specification. The drawings illustrate aspects of some example embodiments of the inventive concept and, together with the description, serve to explain principles of the inventive concept. In the drawings.

DETAILED DESCRIPTION

Figure 1:
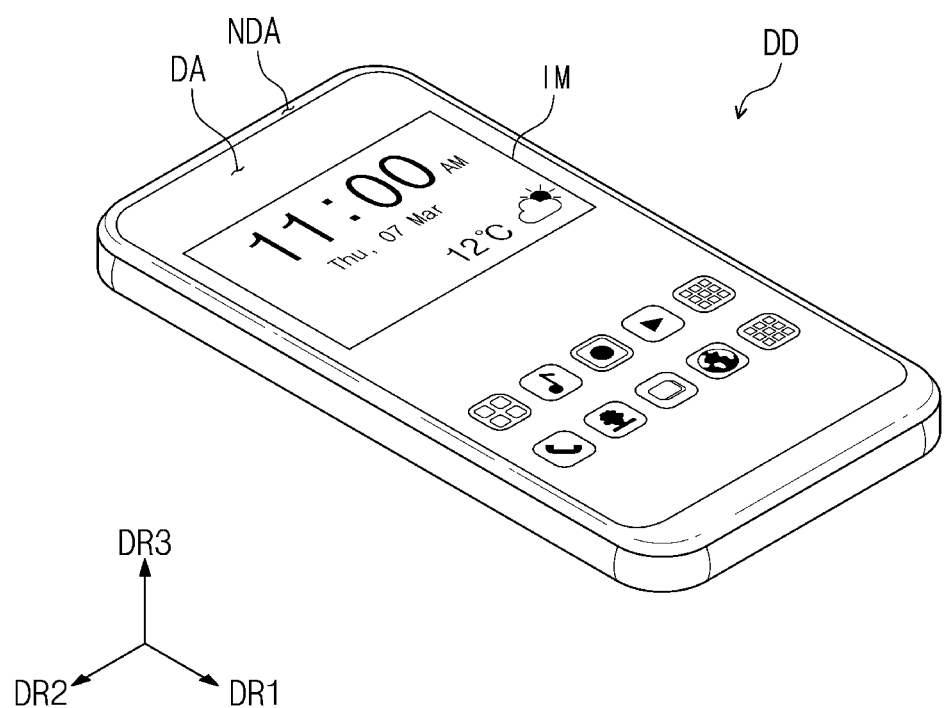
FIG. 1 is a coupled perspective view of a display device according to some example embodiments of the inventive concept.

It will be understood that when an element or layer is referred to as being "on", "connected to" or "coupled to" another element or layer, it can be directly on, connected or coupled to the other element or intervening third elements may be present.

Like reference numerals in the drawings refer to like elements. In addition, in the drawings, the thickness and the ratio and the dimension of the element are exaggerated for effective description of the technical contents. The term "and/or" includes any and all combinations of one or more of the associated items.

Terms such as first, second, and the like may be used to describe various components, but these components should not be limited by the terms. These terms are only used to distinguish one element from another. For instance, a first component may be referred to as a second component, or similarly, a second component may be referred to as a first component, without departing from the scope of the present disclosure. As used herein, the singular forms "a," "an," and "the" may be intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the figures.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which example embodiments belong. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described in more detail with reference to the accompanying drawings.

Figure 2:
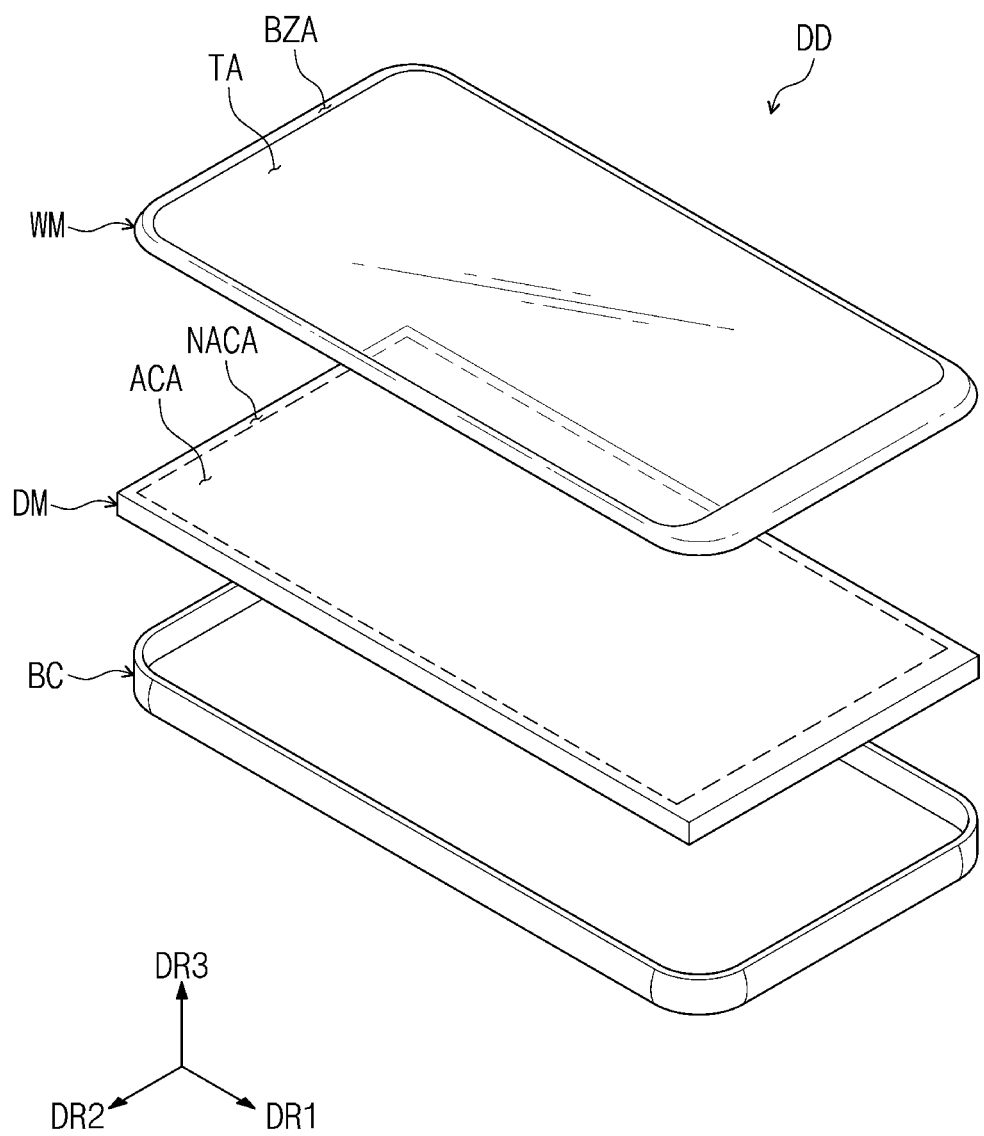
FIG. 2 is an exploded perspective view of a display device according to some example embodiments of the inventive concept.

FIG. 1 is a coupled perspective view of a display device DD according to some example embodiments of the inventive concept. FIG. 2 is an exploded perspective view of the display device DD according to some example embodiments of the inventive concept.

FIG. 1 illustrates an example in which the display device DD is applied to a smartphone. However, embodiments according to the inventive concept are not limited thereto, and the display device DD may be not only a large-sized electronic device such as a television or a monitor, but also a medium or small-sized electronic device such as a mobile phone, a tablet computer, a vehicle navigator, a game device, or a smart watch.

A display area DA and a non-display area NDA may be defined in the display device DD according to some example embodiments.

An image IM may be displayed, or a user input (e.g., a touch, etc.) may be sensed in the display area DA. The display area DA may be parallel to a plane defined by a first direction DR1 and a second direction DR2. A direction normal to the plane of the display area DA, namely, the thickness direction of the display device DD is indicated by a third direction DR3. The front surface (or top surface) and the rear surface (or bottom surface) of each member are distinguished by the third direction DR3. However, directions indicated by the first to third directions DR1, DR2, and DR3 are relative concepts to each other and may be changed to other directions.

The shape of the display area DA illustrated in FIG. 1 is merely an example, and the shape of the display area DA may vary according to the design of the display device DD.

The non-display area NDA is an area which is adjacent to the display area DA, and in which the image IM is not displayed. A bezel area of the display device DD may be defined by the non-display area NDA. The non-display area NDA may surround the display area DA. However, embodiments according to the inventive concept are not limited thereto, and the shapes of the display area DA and the non-display area NDA may be modified. Alternatively, in the display device DD according to some example embodiments, the non-display area NDA may be omitted and only the display area DA may be defined.

Referring to FIGS. 1 and 2, the display device DD according to some example embodiments may include a window WM, a display module DM, and a housing BC.

The window WM may protect the display module DM from an external impact, and provide the user with a display surface. A transmission area TA and a bezel area BZA may be defined in the window WM. The transmission area TA may transmit incident light. For example, the image IM generated by the display module DM passes through the transmission area TA to be viewed by a user. The transmission area TA may overlap the display area DA.

The transmission area TA may have a rectangular shape parallel to each of the first direction DR1 and the second direction DR2. However, this is only an example, and the transmission area TA may have any suitable shape according to the design of the display device DD.

The bezel area BZA may be adjacent to the transmission area TA. For example, the bezel area BZA may surround the transmission area TA. According to some example embodiments, the bezel area BZA may have a prescribed color. The bezel area BZA may overlap the non-display area NDA.

According to some example embodiments, the bezel area BZA may be omitted and only the transmission area TA may be defined in the window WM.

The display module DM may be located under the window WM. The display module DM may be protected by the window WM from an external impact or the like.

The display module DM is parallel to a plane defined by the first direction DR1 and the second direction DR2. The normal direction of the display panel DP (see FIG. 3A) is indicated by the third direction DR3. The third direction DR3 indicates the thickness direction of the display device DD.

An active area ACA and a non-active area NACA may be defined in the display module DM. For example, the non-active area NACA may surround the active area ACA. For example, the non-active area NACA may be adjacent to at least one side of the active area ACA, or the non-active area NACA may be omitted. In addition, the active area ACA may correspond to the transmission area TA defined in the window WM, and the non-active area NACA may correspond to the bezel area BZA.

The non-active area NACA may provide an electrical signal to the active area ACA, or may be formed with wiring lines for receiving electrical signals from the active area ACA.

Although not separately shown, an anti-reflection unit may be disposed between the display module DM and the window WM. The anti-reflection unit may reduce the reflection ratio of external light incident from an upper side of the window WM.

For example, the anti-reflection unit may include a retarder, a polarizer, a destructive interference structure, or a color filter and division pattern. The retarder may be a film type or a liquid crystal coating type, and include a $\lambda/2$ retarder and/or a $\lambda/4$ retarder.

The polarizer may also be a film type or a liquid crystal coating type. The film type may include a stretched synthetic resin film, and the liquid crystal coating type may include liquid crystals arranged in a prescribed arrangement. The retarder and the polarizer may further include protection films.

For example, the destructive interference structure may include a first reflection layer and a second reflection layer formed on different layers. First reflection light and Second reflection light respectively reflected by the first reflection layer and the second reflection layer may destructively interfere with each other, and accordingly the reflection ratio of external light may be reduced.

The color filter may transmit the light generated in the display module DM or convert a wavelength of the light into another wavelength. The division pattern may include a light-shielding material to prevent or reduce instances of colors of light passing through the color filter being mixed. The light-shielding material of the division pattern may absorb the external light. For example, the division pattern may include a blue or black material.

At least a portion of the housing BC may be disposed under the display module DM. The housing BC may accommodate the window WM and the display module DM.

Figure 3A:
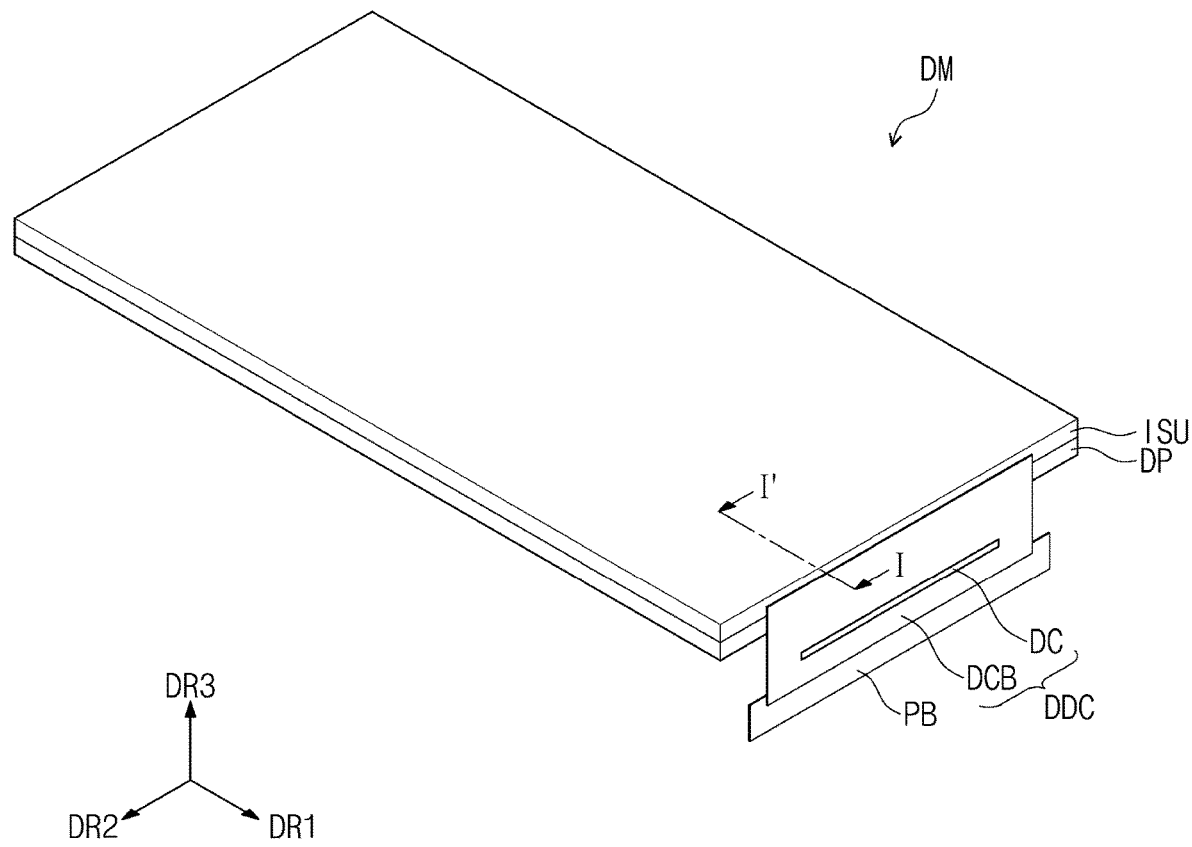
FIG. 3A is a coupled perspective view of a display module according to some example embodiments of the inventive concept.
Figure 3B:
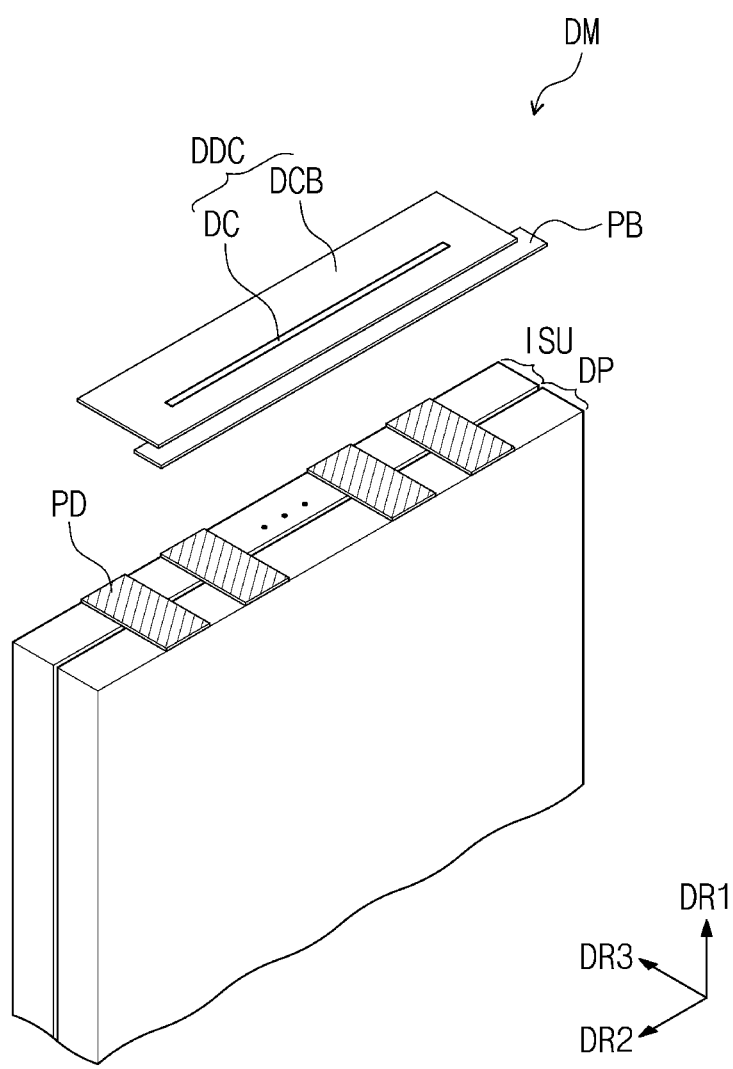
FIG. 3B is an exploded perspective view of a display module according to some example embodiments of the inventive concept.

FIG. 3A is a coupled perspective view of the display module DM according to some example embodiments of the inventive concept. FIG. 3B is an exploded perspective view of the display module DM according to some example embodiments of the inventive concept.

Referring to FIG. 3A, the display module DM may include a display panel DP for generating an image, and an input sensing unit ISU for sensing an external input. In addition, the display module DM may include a plurality of pads PD (see FIG. 3B) for delivering electrical signals to the display panel DP and the input sensing unit ISU, and a driving circuit DDC. The plurality of pads PD (see FIG. 3B) may include a conductive material.

The driving circuit DDC may be connected to a main board through a circuit board PB. Although one driving circuit DDC is illustrated in the drawing, the embodiments are not limited thereto. In other words, the display device DD may include a plurality of driving circuits, and at least any one driving circuit among the plurality of driving circuits may include input pads for providing a driving signal to the input sensing unit ISU.

Furthermore, according to the present description of the inventive concept, the driving circuit DDC is illustrated as being located on any one side surface of the display module DM, but the driving circuit DDC may be provided in plural and disposed on at least any one surface of the display module DM.

The driving circuit DDC may include a driving circuit board DCB and a driving chip DC located on the driving circuit board DCB. The driving circuit board DCB may be electrically connected to each of the display panel DP and the input sensing unit ISU.

According to some example embodiments, the driving circuit board DCB may be provided as a flexible printed circuit board. For example, the driving circuit board DCB may be bent to the bottom surface of the display module DM from one side surface of the display module DM. The driving chip DC may be located on the driving circuit board DCB overlapping the bottom surface of the display module DM.

The driving chip DC may generate overall driving signals required for driving the display panel DP and the input sensing unit ISU of the inventive concept. The driving signals output from the driving chip DC may be delivered to at least one among the display panel DP or the input sensing unit ISU through the driving circuit board DCB.

The display panel DP may be an organic light emitting display panel, a quantum dot display panel, a liquid crystal display panel, a plasma display panel, an electrophoretic display panel, a microelectromechanical system (MEMS) display panel, an electrowetting display panel, or the like.

The input sensing unit ISU may be located between the window WM (see FIG. 2) and the display panel DP. The input sensing unit ISU senses an input applied externally. The input applied externally may be provided in various types. For example, the external input includes various types of external inputs such as a part of the user's body, a stylus pen, light, heat, and pressure. In addition, not only an input generated from a contact by a portion of the body such as a user's finger, but also an input from a touch to a proximal or adjacent space may be one type of the input.

According to some example embodiments, the input sensing unit ISU may be an input sensing layer or an input sensing substrate. For example, the input sensing unit ISU may be provided to an individual panel to be combined with the display panel DP through an adhesive layer.

However, the embodiments of the inventive concept are not limited thereto. For example, the input sensing unit ISU may be such that an input sensing circuit is directly located on the input sensing layer, namely, the display panel DP. In the present specification, that "a component A is directly located on a component B" means that an adhesive layer is not located between component A and component B. Embodiments in which the input sensing unit ISU is the input sensing layer will be described later in more detail.

As another example, the input sensing unit ISU may be omitted.

Referring to FIG. 3B, the display panel DP may include the top surface, the bottom surface, and the side surfaces for connecting the top surface and the bottom surface. A plurality of pads PD may be located on the side surfaces of the display panel DP in order to be electrically connected to the driving circuit board DCB.

FIG. 3B illustrates that the plurality of pads PD are located on the side surfaces of the display panel DP and the input sensing unit ISU. Accordingly, the driving signals output from the driving chip DC may be all delivered to the display panel DP and the input sensing unit ISU through the driving circuit board DCB. However, the embodiments of the inventive concept are not limited thereto.

On the other hand, the display device DD according to some example embodiments of the inventive concept includes a driving circuit DDC located on the side surfaces of the display panel DP to secure a wider active area ACA than a display device in which a driving circuit is located on the top surface of the display panel.

Figure 4A:
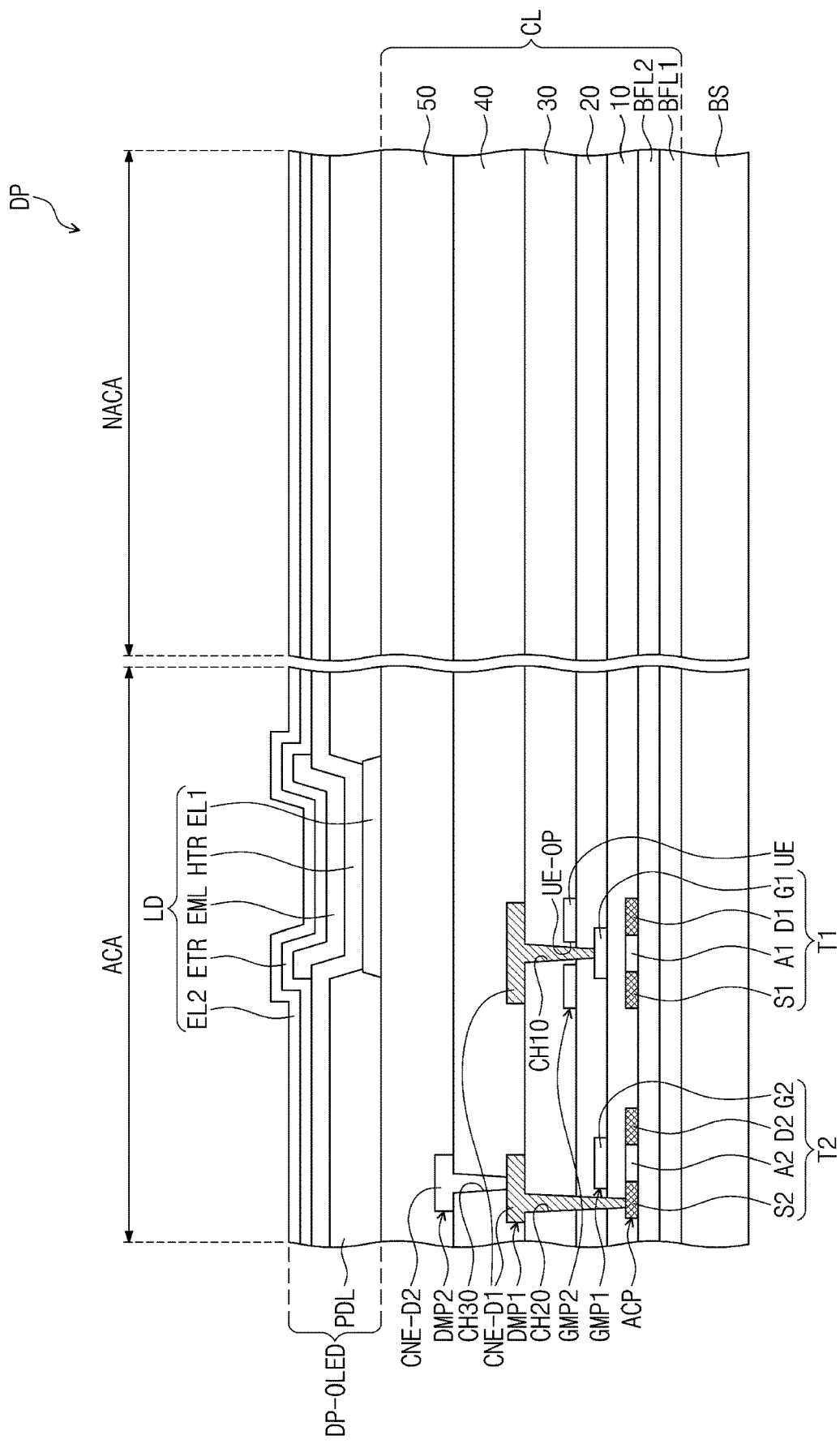
FIG. 4A is a cross-sectional view of a display panel according to some example embodiments of the inventive concept.
Figure 4B:
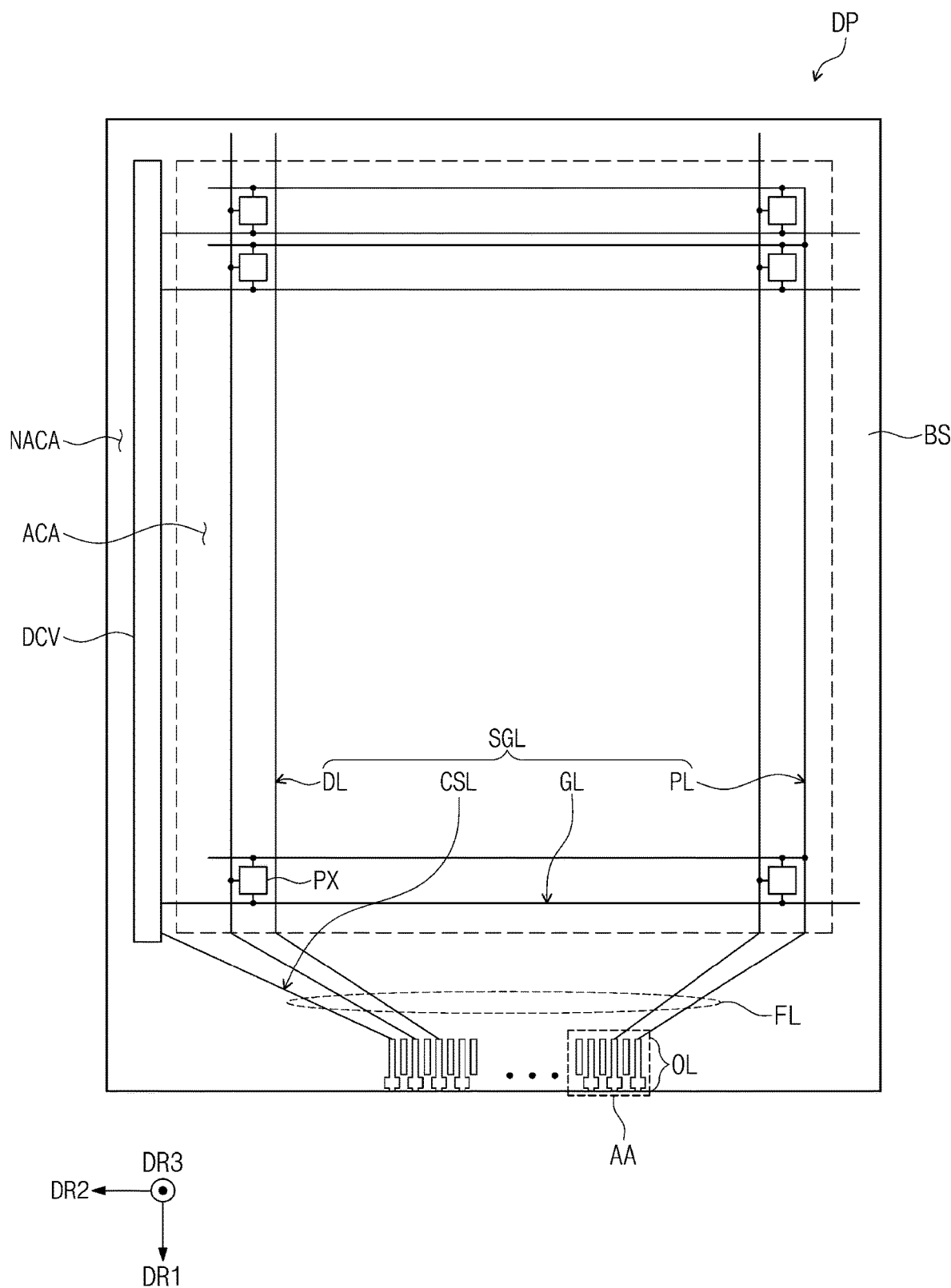
FIG. 4B is a plan view of a display panel according to some example embodiments of the inventive concept.

FIG. 4A is a cross-sectional view of a display panel DP according to some example embodiments of the inventive concept. FIG. 4B is a plan view of a display panel DP according to some example embodiments of the inventive concept.

Referring to FIG. 4A, the display panel DP may include a base layer BS, a circuit layer CL, and a light emitting element layer DP-OLED that are sequentially laminated. In addition, according to some example embodiments, the display panel DP may further include a thin film encapsulation layer or an encapsulation substrate located on the light emitting element layer DP-OLED.

An active area ACA and a non-active area NACA may be defined in the display module DM. As the foregoing, the non-active area NACA may be adjacent to at least one side of the active area ACA, or the non-active area NACA may be omitted.

The base layer BS may include a glass substrate and/or a synthetic resin film, etc. For example, the base layer BS may include a flexible material. The display device DD may be a flexible display device or a rigid display device according to the material of the base layer BS.

According to some example embodiments, the circuit layer CL may include a first buffer layer BFL1, a second buffer layer BFL2, a first insulation layer 10, a second insulation layer 20, a third insulation layer 30, a fourth insulation layer 40, a fifth insulation layer 50, a plurality of semiconductor patterns ACP, a first conductive layer GMP1 including a plurality of patterns, a second conductive layer GMP2 including a plurality of patterns, a third conductive layer DMP1 including a plurality of patterns, and a fourth conductive layer DMP2 including a plurality of patterns.

The first and second buffer layers BFL1 and BFL2 may be inorganic layers. The first to third insulation layers 10, 20, and 30 may be provided with inorganic or organic layers, or provided with mixed layers of an inorganic layer and an organic layer. For example, the first to third insulation layers 10, 20, and 30 may include a silicon nitride layer and a silicon oxide layer. The materials of the inorganic layer and the organic layer are not particularly limited. According to some example embodiments of the inventive concept, the first and second buffer layers BFL1 and BF12 may be selectively formed/omitted. The fourth insulation layer 40 and the fifth insulation layer 50 may be provided with inorganic or organic layers, or with mixed layers of an inorganic layer and an organic layer. For example, the fourth insulation layer 40 and the fifth insulation layer 50 may contain an organic material.

The first to fourth conductive layers GMP1, GMP2, DMP1, and DMP2 may include at least one of molybdenum, titanium, aluminum, or an alloy thereof. In addition, each of the first to fourth conductive layers GMP1, GMP2, DMP1, and DMP2 may include one layer or a plurality of layers.

The first buffer layer BFL1 may be located on the base layer BS. The second buffer layer BFL2 may be located on the first buffer layer BFL1. Each of the first buffer layer BFL1 and the second buffer layer BFL2 prevents or reduces instances of impurity present in the base layer BS from being flowed into the circuit layer CL. For example, the impurities are prevented from being diffused into the semiconductor pattern ACP of the transistors T1 and T2.

The semiconductor pattern ACP is located on the second buffer layer BFL2. The semiconductor pattern ACP may configure each of a plurality of transistors T1 and T2. The semiconductor pattern ACP may include polycrystalline silicon, amorphous silicon, or a metal-oxide semiconductor. FIG. 4A illustrates a semiconductor pattern ACP configuring a source S1, an active channel A1, and a drain D1 of a first transistor T1, and a source S2, an active channel A2, and a drain D2 of a second transistor T2.

According to some example embodiments, the first insulation layer 10 may be located on the second buffer layer BFL2 and cover the semiconductor pattern ACP. The source S1, the active channel A1, and the drain D1 of the first transistor T1, and the source S2, the active channel A2, and the drain D2 of the second transistor T2 may be located under the first insulation layer 10. The first conductive layer GMP1 may be located on the first insulation layer 10. The gate G1 of the first transistor T1 and the gate G2 of the second transistor T2 are illustrated as the first conductive layer GMP1.

The second insulation layer 20 may be located on the first insulation layer 10 and cover the first conductive layer GMP1. The second conductive layer GMP2 may be located on the second insulation layer 20. According to some example embodiments of the inventive concept, the second conductive layer GMP2 may be one between two electrodes forming a capacitor of the pixel PX (see FIG. 4B). An upper electrode UE is illustrated as the second conductive layer GMP2. An opening unit UE-OP may be defined in the upper electrode UE.

The third insulation layer 30 may be located on the second insulation layer 20 and cover the second conductive layer GMP2. The third conductive layer DMP1 may be located on the third insulation layer 30. Two connection electrodes CNE-D1 are illustrated, for example, as the third conductive layer DMP1.

One connection electrode CNE-D1 is connected to a gate G1 of the first transistor T1 through a contact hole CH10 penetrating through the second insulation layer 20 and the third insulation layer 30. The contact hole CH10 passes through the opening unit UE-OP.

The other connection electrode CNE-D1 is connected to the source S2 of the second transistor T2 through a contact hole CH20 penetrating through the first insulation layer 10, the second insulation layer 20 and the third insulation layer 30.

The fourth insulation layer 40 may be located on the third insulation layer 30 and cover the third conductive layer DMP1. The fourth conductive layer DMP2 may be located on the fourth insulation layer 40. One connection electrode CNE-D2 is illustrated, for example, as the fourth conductive layer DMP2. The connection electrode CNE-D2 may be connected to a corresponding connection electrode CNE-D1 through a contact hole CH30 penetrating through the fourth insulation layer 40.

The fifth insulation layer 50 may be located on the fourth insulation layer 40 and cover the fourth conductive layer DMP2.

On the other hand, according to some example embodiments of the inventive concept, a portion of the first transistor T1 and the second transistor T2 may be modified to a bottom-gate structure.

The light emitting element layer DP-OLED is located on the fifth insulation layer 50. The light emitting element layer DP-OLED may include a pixel definition layer PDL and a light emitting element LD. The pixel definition layer PDL may include an organic material. The pixel definition layer PDL may be located on the fifth insulation layer 50 and expose at least a portion of the first electrode EL1.

The light emitting element LD may be an organic light emitting element, a micro LED, or a light emitting element using a quantum dot.

The light emitting element LD may include a first electrode EL1, a hole transport region HTR, a light emitting layer EML, an electron transport region ETR, and a second electrode EL2. The first electrode EL1 and the second electrode EL2 may include, for example, Ag, Mg, Cu, Al, Pt, Pd, Au, Ni, Nd, Ir, Cr, Li, Ca, LiF/Ca, LiF/Al, Mo, Ti, or a compound or mixture thereof (e.g., a mixture of Ag and Mg), ITO (indium tin oxide), indium zinc oxide (IZO), zinc oxide (ZnO), indium tin zinc oxide (ITZO), or the like.

The first electrode EL1 may be located on the fifth insulation layer 50. According to some example embodiments, as the foregoing, the first electrode EL1 may be connected to a transistor through a contact hole.

When the light emitting element LD is an organic light emitting diode OLED, at least one of the hole transport region HTR, the light emitting layer EML, or the electron transport region ETR may include an organic material. According to some example embodiments of the inventive concept, when the light emitting element LD is a micro LED, the light emitting layer EML may include an inorganic material.

Referring to FIG. 4B, the active area ACA and the non-active area NACA may be defined in the display panel DP. As the foregoing, the non-active area NACA may be adjacent to at least one side of the active area ACA, or the non-active area NACA may be omitted. The plurality of pixels PX may be located in the active area ACA. Each of the pixels PX may include the light emitting element LD as a display element. For example, the light emitting element LD may be an organic electroluminescent element.

A plurality of signal lines SGL providing signals to the pixels PX may be located in the active area ACA and the non-active area NACA.

The plurality of signal lines SGL include gate lines GL, data lines DL, a power supply line PL and a control signal line CSL. The gate lines GL are respectively connected to corresponding pixels PX among the plurality of pixels PX, and the data lines DL may be respectively connected to corresponding pixels PX among the plurality of pixels PX. The power supply line PL is connected to the plurality of pixels PX. In addition, the gate driving circuit DCV connected to the gate lines GL may be located in the non-active area NACA. The control signal line CSL may provide control signals to the gate driving circuit DCV.

The plurality of signal lines SGL may be connected to an external circuit board to provide electrical signals to the pixels PX.

Some of the plurality of signal lines SGL may extend to one end of the display panel DP. For example, the base layer BS according to some example embodiments may have a rectangular shape including a long side extending in the first direction DR1 and a short side extending in the second direction DR2. Some of the plurality of signal lines SGL may extend in the first direction DR1 towards one end of the display panel DP. Some of the plurality of signal lines SGL may be located in concentration, as further extending to one end of the display panel DP. The concentrated lines may be connected to an external circuit board of the display panel DP. For example, the plurality of signal lines SGL may be electrically connected to the foregoing driving circuit board DCB (FIG. 3A).

Lines located adjacent to an outer edge of the display panel DP among the plurality of signal lines SGL are defined as outer lines OL. The outer lines OL may be electrically connected to a plurality of pads PD (see FIG. 3B) located in a side surface of the display panel DP. FIG. 4B illustrates a plan view of the display panel DP when the plurality of pads PD are omitted.

Lines among the plurality of signal lines SGL, which connect the outer lines OL with the pixels PX, are defined as connection lines FL. The connection lines FL may be to connect the pixels PX and the outer lines OL. The connection lines FL may extent along the long side of the display panel DP and located more adjacent (e.g., closer) to the active area ACA than the outer lines OL.

The connection lines FL and the outer lines OL may be formed in a higher concentration than the plurality of signal lines SGL located in the active area ACA. As going further to one end of the display panel DP, the concentration of lines becomes higher, and the outer lines OL have a higher concentration of lines than the connection lines FL.

On the other hand, in FIG. 4B, the connection lines FL and the outer lines OL are illustrated adjacent to the short side of the display panel DP, but the embodiments of the inventive concept are not limited thereto. According to some example embodiments, the connection lines FL and the outer lines OL may be arranged adjacent to a long side of the display panel DP.

Figure 5:
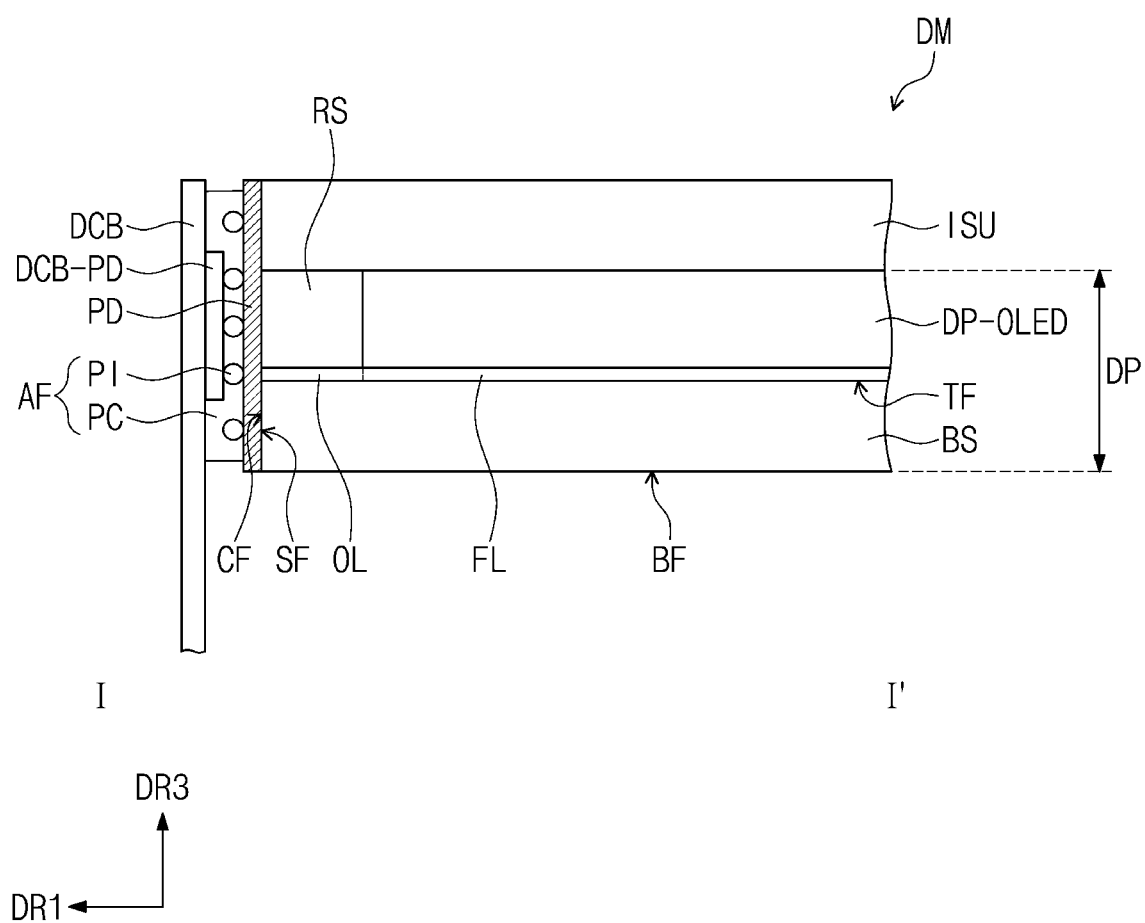
FIG. 5 is a cross-sectional view taken along a line I-I' of FIG. 3A.

FIG. 5 is a cross-sectional view taken along a line I-I' of FIG. 3A according to some example embodiments of the inventive concept. Referring to FIG. 5, the display module DM according to some example embodiments may include a display panel DP, an input sensing unit ISU located on the display panel DP, and a driving circuit board DCB arranged on a side surface of the display panel DP. The display panel DP is illustrated such that some components are omitted, and the base layer BS, the outer lines OL, the connection lines FL, and the light emitting element layer DP-OLED are included. A resin RS is located on the outer lines OL, and is arranged at a side surface of the display panel DP to support a plurality of pads PD. The resin RS may flatten a side surface CF of the display module DM. In other words, the resin RS may play a role of filling the space between the base layer BS and the input sensing unit ISU. Specifically, the resin RS may cover the outer lines OL located on the base layer BS, and fill the space between the outer lines OL and the input sensing unit ISU.

The thickness of the resin RS may be adjusted according to the thickness of the outer lines OL. A description thereabout will be provided later with reference to FIGS. 7A to 7D.

As the outer lines OL are covered with the resin RS, damage to the outer lines OL in a process for arranging the plurality of pads PD on the side surface CF of the display module DM may be prevented or reduced. For example, in a process for sputtering the side surface CF of the display module DM, the outer lines OL may be protected by the resin RS and instances of disconnection of the outer lines OL may be prevented or reduced.

The resin RS may include a transparent material. For example, the resin RS may include a photo-curing agent. The resin RS may include an organic material or an inorganic material. For example, the resin RS may include an epoxy resin, an acrylic resin, a urethane resin, or a compound or mixture thereof. According to some example embodiments, the display device DD may include a frit instead of the resin RS.

The base layer BS includes the top surface TF, the bottom surface BF opposite to the top surface TF, and a side surface SF. The side surface SF connects the top surface TF and the bottom surface BF. In FIG. 5, one side surface SF is illustrated, but the side surface SF may be provided in plural. For example, four side surface SF may be provided. The outer lines OL are located on the top surface TF of the base layer BS in adjacent to the side surface SF. The connection lines FL may be extended from the outer lines OL. The outer lines OL may be connected to the light emitting element layer DP-OLED through the connection lines FL.

The plurality of pads PD are located on the side surface SF of the base layer BS. The plurality of pads PD contact the outer lines OL. The plurality of pads PD may be electrically connected to the driving circuit board DCB through an anisotropic conductive film AF. The anisotropic conductive film AF includes conductive particles PI formed inside an adhesive film PC having the adhesiveness.

The conductive particles PI may electrically connect the plurality of driving pads DCB-PD of the driving circuit board DCB and the plurality of pads PD. Accordingly, the electrical signal delivered from the driving circuit board DCB may be delivered in the order of the plurality of pads PD, the outer lines OL, and the connection lines FL to be provided to the light emitting element layer DP-OLED.

FIG. 5 illustrates an embodiment in which the plurality of pads PD are located on the entirety of the side surface CF of the display module DM. The side surface CF of the display module DM may be the same plane as the side surface SF of the base layer BS. The plurality of pads PD are formed on the entirety of the side surface CF of the display module DM to provide the electrical signal delivered from the driving circuit board DCB to at least one of the display panel DP or the input sensing unit ISU.

FIGS. 6A to 6H are example enlarged views of the area AA illustrated in FIG. 4B.

Figure 6A:
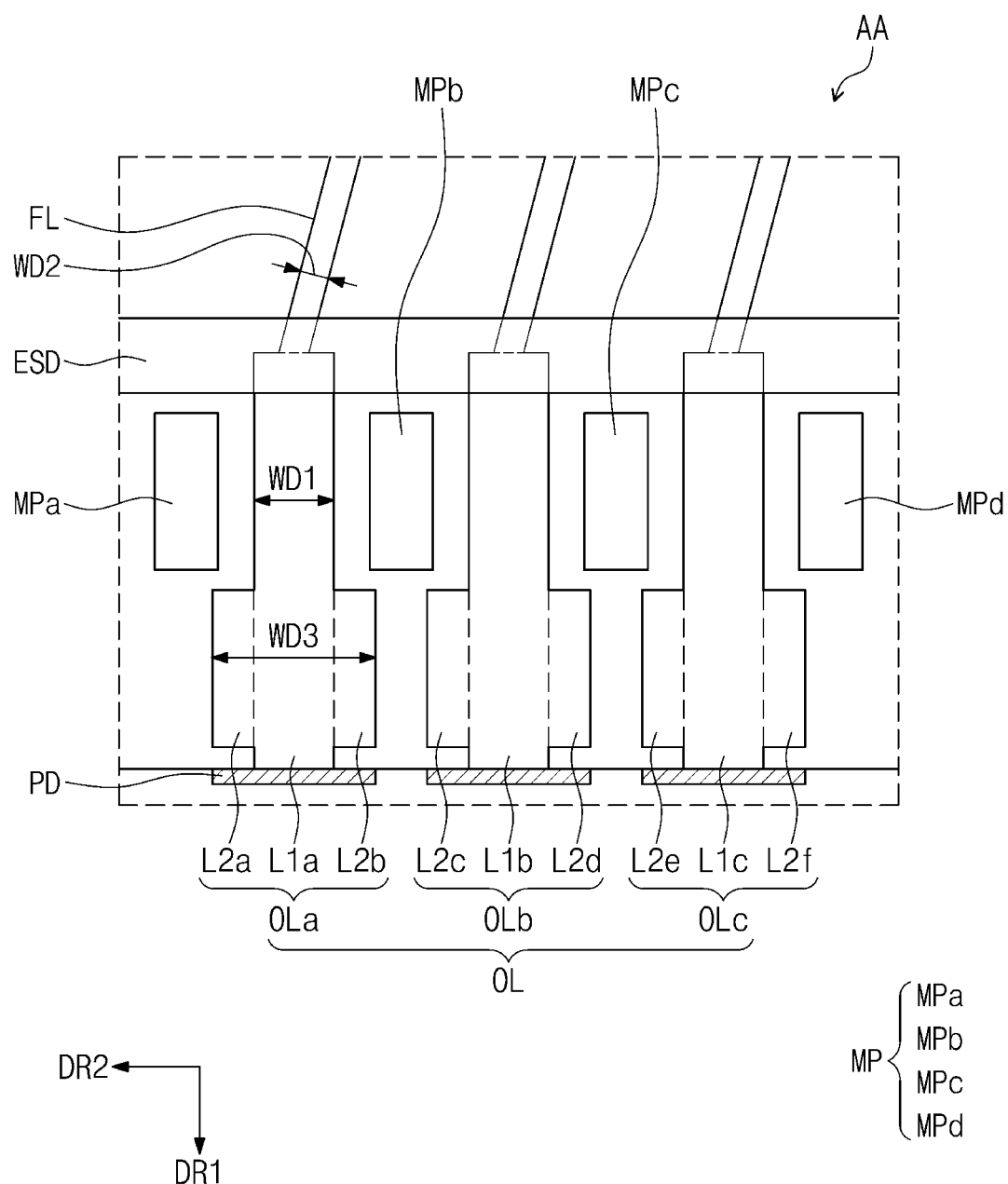
FIGS. 6A to 6H are example enlarged views of the area AA illustrated in FIG. 4B.

Referring to FIGS. 4B and 6A, the area AA is an enlarged view of one end of the display panel DP. In the area AA, the outer lines OL and the connection lines FL located on the top surface TF (see FIG. 5) of the base layer BS, and the plurality of pads PD located on the side surface SF (see FIG. 5) of the base layer BS may be located. The plurality of pads PD may be patterned by irradiating a metal located on the side surface SF with a laser beam. The laser beam may be irradiated towards the display panel DP in the direction of the side surface SF.

On the other hand, an electrostatic discharge circuit ESD may be located on the base layer BS. The electrostatic discharge circuit ESD may prevent or reduce instances of lines being damaged by the concentration of the static electricity to an area in which the lines are concentrated. For example, the electrostatic discharge circuit ESD may be located in one end of the display panel DP to prevent or reduce instances of the connection lines FL or the outer lines OL being damaged by the static electricity. The electrostatic discharge circuit ESD may be arranged such that it is overlapping with at least one of the connection lines FL or the outer lines OL on a plane.

Referring to the area AA, the outer lines OL may be provided in plural. For example, the outer lines OL may include a first outer line OLa, a second outer line OLb, and a third outer line OLc. The first to third outer lines OLa, OLb, and OLc may be sequentially arranged along the opposite direction to the second direction DR2.

According to some example embodiments, the first outer line OLa may include a center line L1a extending along the first direction DR1 and branch lines L2a and L2b extending from both sides of the center line L1a in the second direction DR2 or in the opposite direction to the second direction DR2. The branch lines L2a and L2b extend so as to have a line symmetric structure on the basis of the center line L1, but the embodiments according to the inventive concept are not limited thereto. For example, any one among the branch lines L2a and L2b may be omitted. Alternatively, the branch lines L2a and L2b may be formed in a staggered arrangement.

The second outer line OLb may include a center line L1b extending along the first direction DR1 and branch lines L2c and L2d extending from the center line L1b in the second direction DR2 or in the opposite direction to the second direction DR2.

The third outer line OLc may include a center line L1c extending along the first direction DR1 and branch lines L2e and L2f extending from the center line L1c in the second direction DR2 or in the opposite direction to the second direction DR2.

The center lines L1a, L1b, and L1c may extend from the connection lines FL. The width WD1 of each of the center lines L1a, L1b, and L1c may be greater than that WD2 of each of the connection lines FL. In addition, since the first to third outer lines OLa, OLb, and OLc include the branch lines L2a, L2b, L2c, L2d, L2e, and L2f, the width WD3 of each of the first to third outer lines OLa, OLb, and OLc may be greater than that WD1 of each of the connection lines FL.

The display panel DP according to some example embodiments may further include a dummy pattern MP located adjacent to the outer lines OL. One or a plurality of the dummy patterns MP may be present. For example, the dummy pattern MP may include a plurality of dummy patterns MPa, MPb, MPc, and MPd located between the first to third outer lines OLa, OLb, and OLc. The dummy patterns MP and the outer lines OL may be alternately arranged in the second direction DR2.

In the first direction DR1, at least one of a plurality of dummy patterns MPa, MPb, MPc, or MPd may overlap at least some of the outer lines OL. For example, at least one of the plurality of dummy patterns MPa, MPb, MPc, or MPd may overlap at least one of the branch lines L2a, L2b, L2c, L2d, L2e, or L2f in the first direction DR1.

The dummy patterns MP may include a metal, and one or a plurality of layers. According to some example embodiments, the dummy pattern MP may include the same material as the outer lines OL. According to some example embodiments, the dummy pattern MP may have the same layer structure as the outer lines OL. However, the embodiments of the inventive concept are not limited thereto, and the dummy patterns MP and the outer lines OL may include different materials from each other, and have different layer structures.

According to some example embodiments, the electrostatic discharge circuit ESD may overlap at least one of the dummy patterns MP or the outer lines OL in the first direction DR1. In other words, the entire surface of the electrostatic discharge circuit ESD may overlap the dummy pattern MP and the outer lines OL in the first direction DR1.

According to some example embodiments, the connection lines FL may overlap at least one of the dummy patterns MP or the outer lines OL in the first direction DR1. In other words, the entire surface of the connection lines FL may overlap the dummy pattern MP and the outer lines OL in the first direction DR1.

Accordingly, even when a laser beam is irradiated in the internal direction of the display panel DP in a process for patterning the plurality of pads PD, the electrostatic discharge circuit ESD or the connection lines FL may be arranged to overlap the dummy patterns MP and the outer lines OL to prevent or reduce instances of the laser beam being incident towards the electrostatic discharge circuit ESD or the connection lines FL. The display device DD according to some example embodiments may include the dummy pattern MP and the outer lines OL to prevent or reduce instances of the electrostatic discharge circuit ESD or the connection lines FL being damaged by the laser beam.

The shapes of the dummy pattern MP and the outer lines OL may be diversified. Specifically, the shapes of the dummy patterns MP and the branch lines L2a, L2b, L2c, L2d, L2e, and L2f may be unrestrictedly employed, and may be, for example, circular or polygonal.

In FIG. 6A, at least one of the dummy patterns MP or the branch lines L2a, L2b, L2c, L2d, L2e, or L2f are illustrated to have a rectangular shape. However, the embodiments according to the inventive concept are not limited thereto.

Figure 6B:
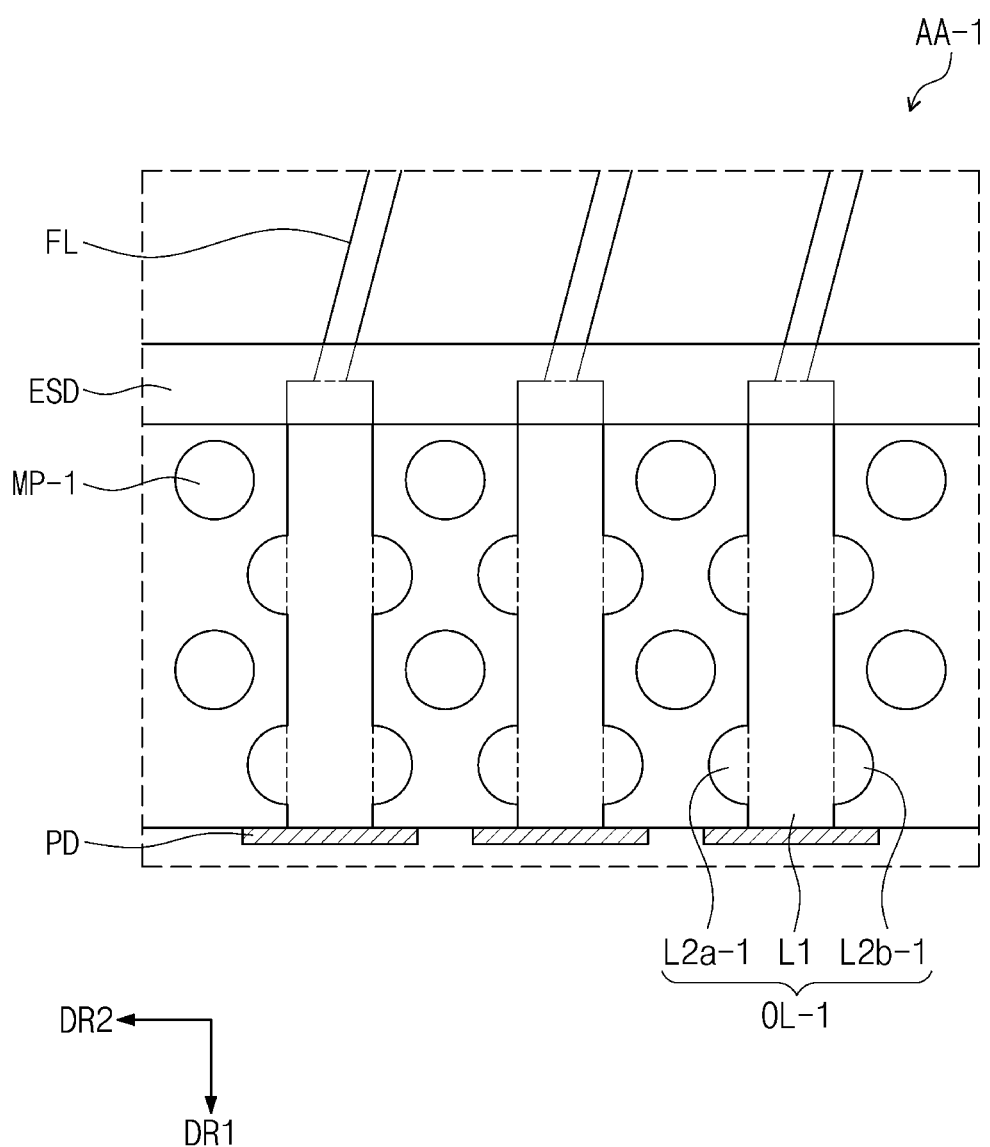

In an area AA-1 in FIG. 6B, at least one of the dummy pattern MP-1 or the outer line OL-1 is illustrated to have a circular shape. For example, the dummy pattern MP-1 may have a circular shape. The branch lines L2a-1 and L2b-1 may have a semicircular shape. According to some example embodiments, the dummy pattern MP-1 may overlap at least one of the branch lines L2a-1 or L2b-1 in the first direction DR1.

Figure 6C:
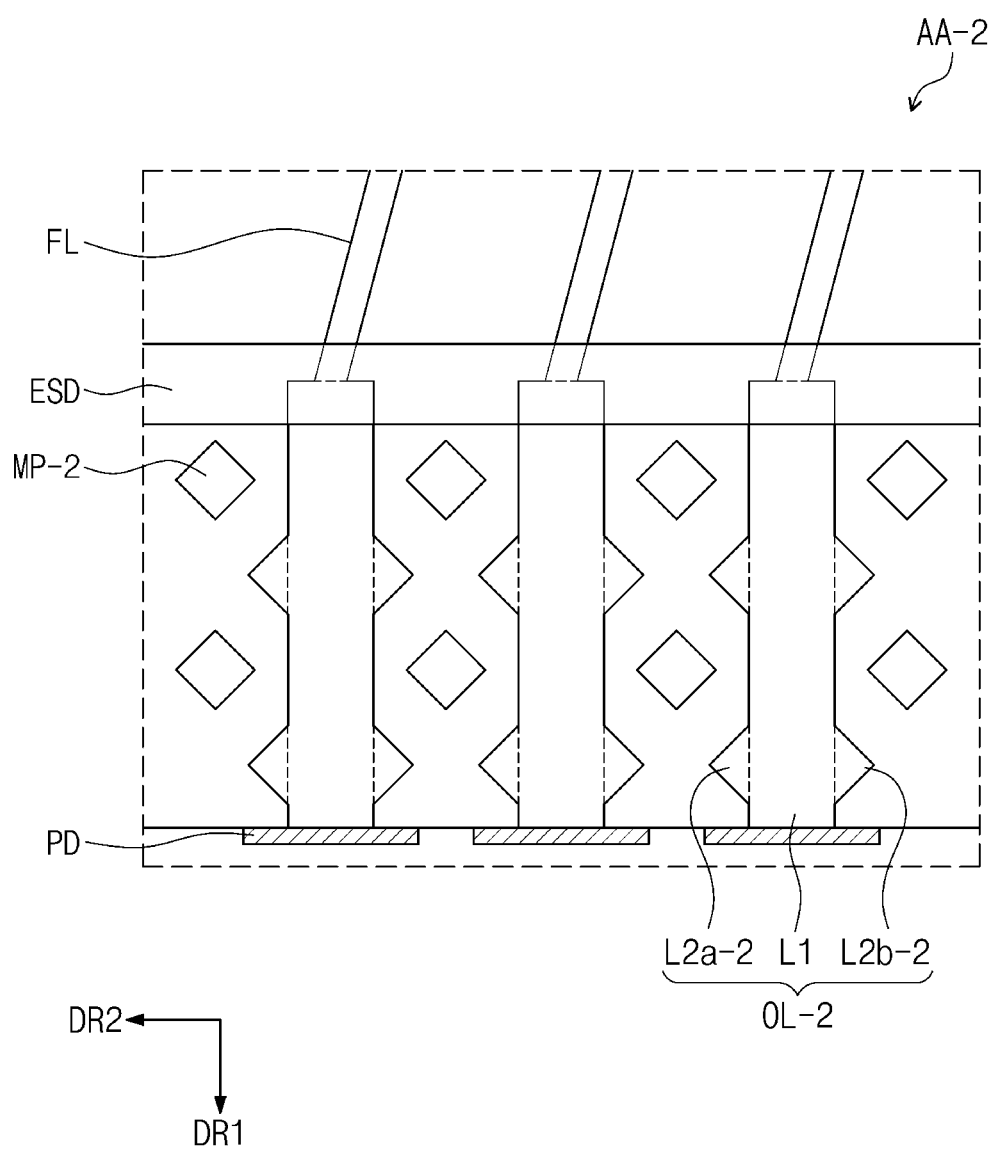

In an area AA-2 in FIG. 6C, the dummy pattern MP-2 is illustrated to have a diamond shape, and the branch lines L2a-2 and L2b-2 of the outer line OL-2 have a triangular shape. According to some example embodiments, the dummy pattern MP-2 may overlap at least one of the branch lines L2a-2 or L2b-2 in the first direction DR1.

FIGS. 6A to 6C illustrate the display panel DP having all of the dummy patterns MP, MP-1, or MP-2 and the outer lines OL, OL-1, or OL-2, but the embodiments of the inventive concept are not limited thereto. The display panel DP may not include the dummy pattern.

Figure 6D:
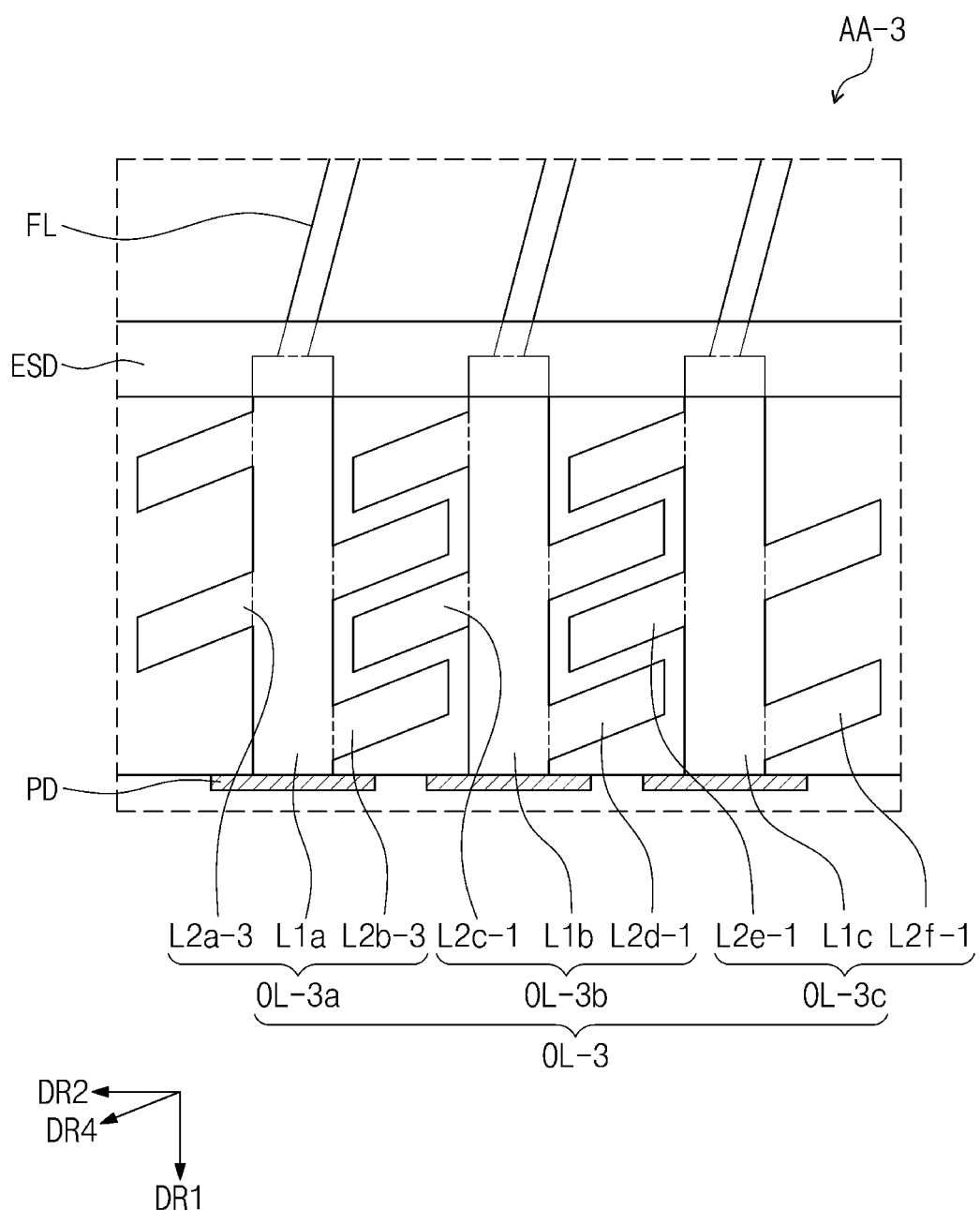

FIG. 6D illustrates an area AA-3 including the outer line OL-3 with the dummy pattern omitted. The outer line OL-3 according to some example embodiments may include a first outer line OL-3a, a second outer line OL-3b, and a third outer line OL-3c sequentially deployed along the opposite direction to the second direction DR2.

According to some example embodiments, the first outer line OL-3a may include the center line L1a, a branch line L2a-3 extending in a fourth direction DR4 from the center line L1a, and a branch line L2b-3 extending in the opposite direction to the fourth direction DR4. The one pair of branch lines L2a-3 and L2b-3 may not overlap in the second direction DR2.

The second outer line OL-3b may include the center line L1b, a branch line L2c-1 extending in the fourth direction DR4 from the center line L1b, and a branch line L2d-1 extending in the opposite direction to the fourth direction DR4.

The third outer line OL-3c may include the center line L1c, a branch line L2e-1 extending in the fourth direction DR4 from the center line L1c, and a branch line L2f-1 extending in the opposite direction to the fourth direction DR4.

The branch lines L2a-3, L2b-3, L2c-1, L2d-1, L2e-1, and L2f-1 according to some example embodiments may overlap branch lines L2a-3, L2-b-3, L2c-1, L2d-1, L2e-1, and L2f-1 extending from the neighboring center lines L1a, L1b, and L1c each other.

For example, the branch line L2b-3 of the first outer line OL-3a may overlap the branch line L2c-1 of the second outer line OL-3b in the first direction DR1. For example, the branch line L2d-1 of the second outer line OL-3b may overlap the branch line L2e-1 of the third outer line OL-3c in the first direction DR1.

Accordingly, even when a laser beam is irradiated in the internal direction of the display panel DP in the process for patterning the plurality of pads PD, the electrostatic discharge circuit ESD or the connection lines FL may be arranged to overlap the outer line OL-3 to prevent or reduce damage caused by the laser beam.

Figure 6E:
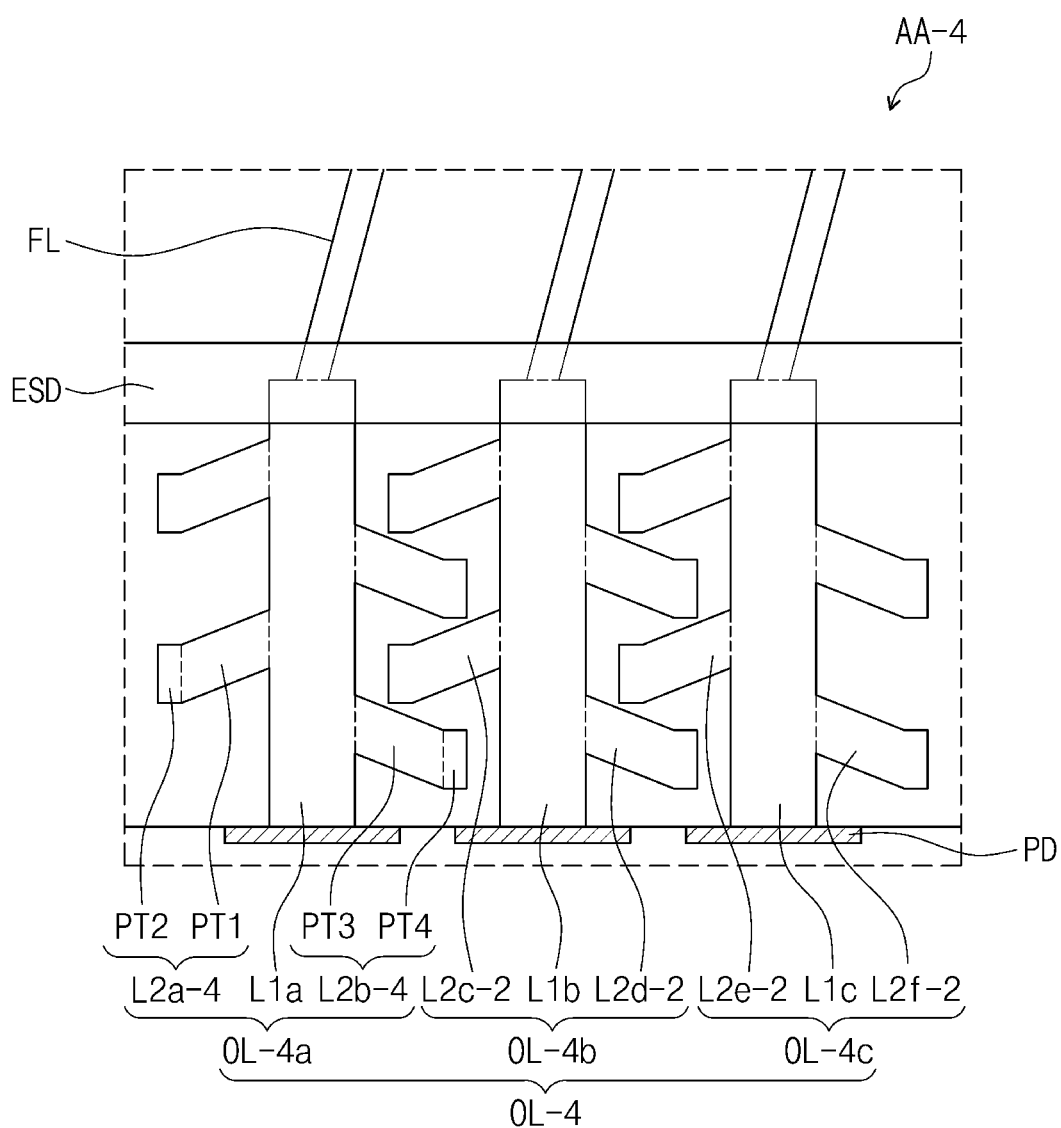

An outer line OL-4 illustrated in FIG. 6E is obtained by modifying one ends of the branch lines L2a-3, L2b-3, L2c-1, L2d-1, L2e-1, and L2f-1 of the outer line OL-3 illustrated in FIG. 6D. In an area AA-4 in FIG. 6E, the outer line OL-4 according to some example embodiments may include a first outer line OL-4a, a second outer line OL-4b, and a third outer line OL-4c sequentially deployed along the opposite direction to the second direction DR2. Each of the branch lines L2a-4, L2b-4, L2c-2, L2d-2, L2e-2, and L2f-2 of the outer line OL-4 according to some example embodiments may extend in two or more directions. For example, the branch line L2a-4 may include a first part PT1 extending from the center line L1a in the fourth direction DR4, and a second part PT2 extending from the first part PT1 in the second direction DR2. Alternatively, the branch line L2b-4 may include a third part PT3 extending from the center line L1a in a fifth direction DR5, and a fourth part PT4 extending from the third part PT3 in the opposite direction to the second direction DR2. The second part PT2 may extend in a direction parallel to the short side of the display panel DP.

Figure 6F:
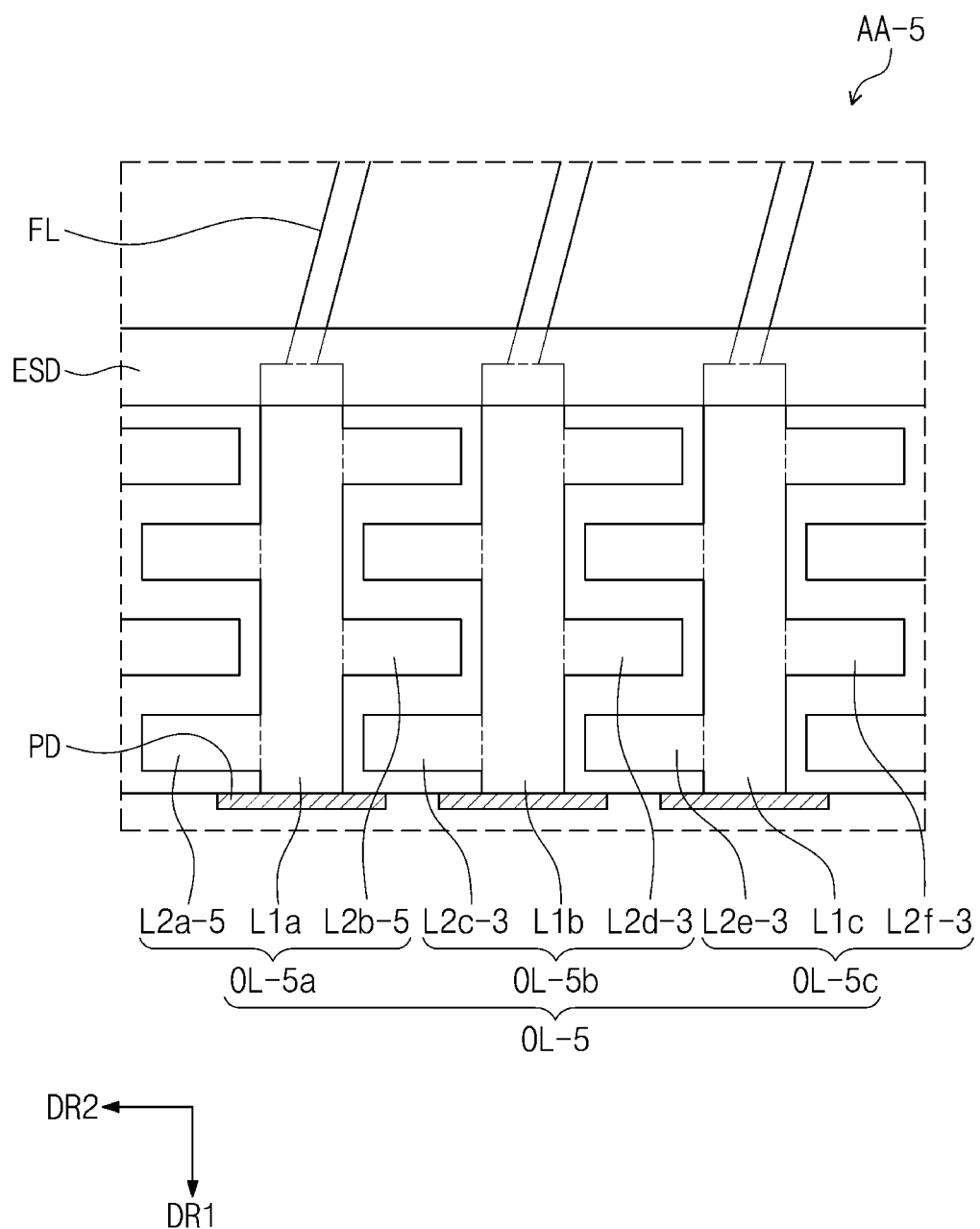

An outer line OL-5 illustrated in FIG. 6F illustrates an embodiment in which the extension direction of the branch lines L2a-3, L2b-3, L2c-1, L2d-1, L2e-1, and L2f-1 of the outer line OL-3 illustrated in FIG. 6D is modified. Each of the branch lines L2a-5, L2b-5, L2c-3, L2d-3, L2e-3, and L2f-3 of the outer line OL-5 according to some example embodiments may be a part extending from the center lines L1a, L1b, and L1c in the second direction DR2 or the opposite direction to the second direction DR2 in an area AA-5 in FIG. 6F.

The outer line OL-5 according to some example embodiments may include a first outer line OL-5a, a second outer line OL-5b, and a third outer line OL-5c sequentially deployed along the opposite direction to the second direction DR2.

According to some example embodiments, the first outer line OL-5a may include the center line L1a and branch lines L2a-5 and L2b-5 extending from the center line L1a in the second direction DR2 or in the opposite direction to the second direction DR2. The one pair of branch lines L2a-5 and L2b-5 may be arranged to not overlap in the second direction DR2.

The second outer line OL-5b may include the center line L1b and branch lines L2c-3 and L2d-3 extending from the center line L1b in the second direction DR2 or in the opposite direction to the second direction DR2.

The third outer line OL-5c may include the center line L1c and branch lines L2e-3 and L2f-3 extending from the center line L1c in the second direction DR2 or in the opposite direction to the second direction DR2.

The branch line L2a-5, L2b-5, L2c-3, L2d-3, L2e-3 and L2f-3 according to some example embodiments may overlap the branch lines L2a-5, L2b-5, L2c-3, L2d-3, L2e-3, and L2f-3 extending from the neighboring outer lines OL-5.

For example, the branch line L2b-5 of the first outer line OL-5a may overlap the branch line L2c-3 of the second outer line OL-5b in the first direction DR1. For example, the branch line L2d-3 of the second outer line OL-5b may overlap the branch line L2e-3 of the third outer line OL-5c in the first direction DR1.

However, the embodiments of the inventive concept are not limited thereto. Outer lines OL-6 and OL-7 in embodiments may not include a branch line.

Figure 6G:
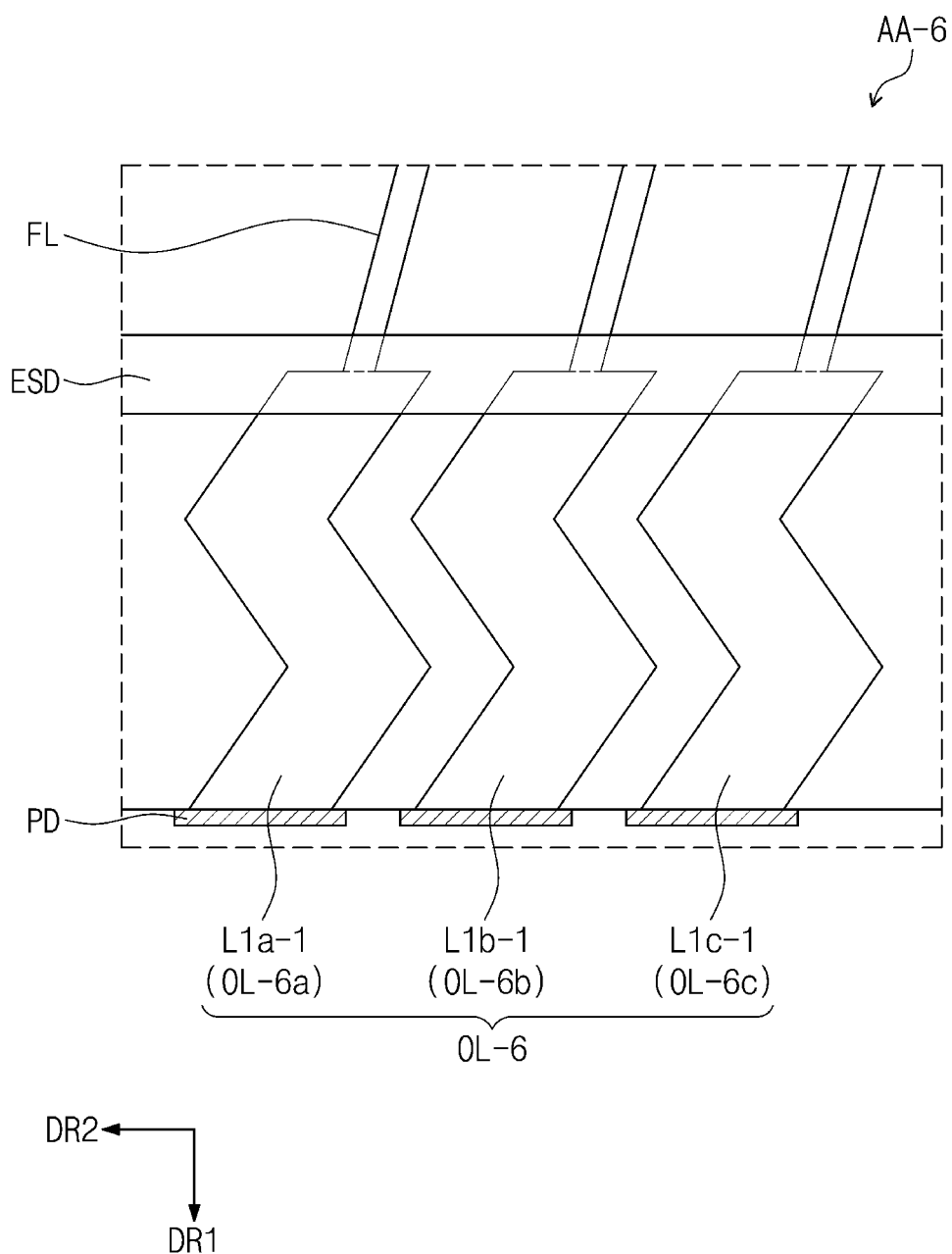

Referring to FIG. 6G, in an area AA-6, the outer line OL-6 according to some example embodiments may be formed of a center line L1a-1. For example, the outer line OL-6 may be formed of the center line L1a-1 having a zigzag shape.

The outer lines OL-6 according to some example embodiments may be provided in plural. For example, the outer line OL-6 may include first to third outer lines OL-6a, OL-6b, and OL-6c deployed in the opposite direction to the second direction DR2. The first to third outer lines OL-6a, OL-6b, and OL-6c may respectively include the first to third center lines L1a-1, L1b-1, and L1c-1.

The first to third outer lines OL-6a, OL-6b, and OL-6c may not include a separate branch line, but may be respectively formed of the first to third center lines L1a-1, L1b-1, and L1c-1 to maintain an interval between neighboring outer lines constant. For example, the interval between the first outer line OL-6a and the second outer line OL-6b may be maintained constant along the first direction DR1. The interval in the present specification is obtained by measuring the distance between components in the second direction DR2.

The first to third outer lines OL-6a, OL-6b, and OL-6c are arranged more adjacently (e.g., closer) to a side surface of the display panel DP than the connection lines FL and the electrostatic discharge circuit ESD. The first to third outer lines OL-6a, OL-6b, and OL-6c respectively contact the plurality of pads PD located on the side surface of the display panel DP.

According to some example embodiments, as the first to third center lines L1a-1, L1b-1, and L1c-1 have the zigzag shape, the entire surface of the connection lines FL and the electrostatic discharge circuit ESD may overlap the outer line OL-6 in the first direction DR1.

In other words, when the side surface of the display panel DP is viewed in the first direction DR1, only the outer line OL-6 is viewed and the entire surfaces of the connection lines FL and the electrostatic discharge circuit ESD may be hidden by the outer line OL-6.

Accordingly, even when a laser beam is irradiated in the internal direction of the display panel DP in the process for patterning the plurality of pads PD on the side surface of the display panel DP, the electrostatic discharge circuit ESD and the connection lines FL may be arranged to overlap the outer line OL-6 to prevent or reduce damage caused by the laser beam.

However, the embodiments of the inventive concept are not limited thereto. The shape of the outer line OL-6 may be deformed without limit.

Figure 6H:
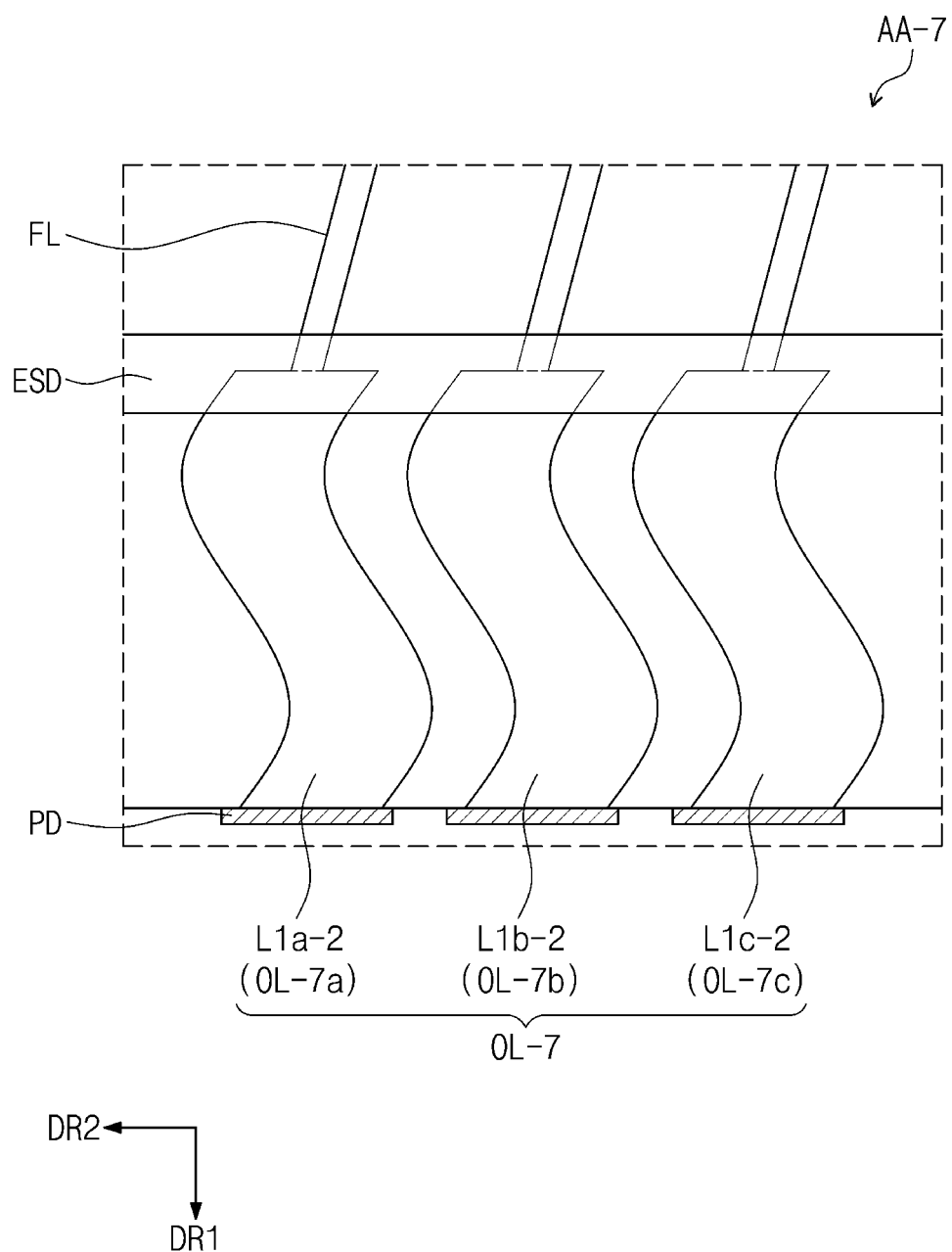

Referring to FIG. 6H, in an area AA-7, an outer line OL-7 according to some example embodiments may be formed of a center line L1a-2. For example, the outer line OL-7 may be formed of the center line L1a-2 having a wave shape. As the foregoing with reference to FIG. 6G, as the center line L1a-2 has the wave shape, the entire surfaces of the connection lines FL and the electrostatic discharge circuit ESD may overlap the outer line OL-7 in the first direction DR1.

On the other hand, the outer line OL-7 may be provided in plural, for example, first to third outer lines OL-7a, OL-7b, and OL-7c deployed in the opposite direction to the second direction DR2. The first to third outer lines OL-7a, OL-7b, and OL-7c may respectively include the first to third center lines L1a-2, L1b-2, and L1c-2.

The first to third outer lines OL-7a, OL-7b, and OL-7c according to some example embodiments may not include a separate branch line, but may respectively include the first to third center lines L1a-2, L1b-2, and L1c-2 to maintain an interval between neighboring outer lines constant. For example, the interval between the first outer line OL-7a and the second outer line OL-7b may be maintained constant along the first direction DR1.

The first to third outer lines OL-7a, OL-7b, and OL-7c are arranged more adjacently (e.g., closer) to a side surface of the display panel DP than the connection lines FL and the electrostatic discharge circuit ESD. The first to third outer lines OL-7a, OL-7b, and OL-7c respectively contact the plurality of pads PD disposed on the side surface of the display panel DP.

Referring to FIGS. 6G and 6H, the outer lines OL-6 and OL-7 in the embodiments may not include a branch line, but may be formed only of the center lines L1a-1, L1b-1, L1c-1, L1a-2, L1b-2, and L1c-2. Accordingly, even when the arrangement interval of the outer lines OL-6 and OL-7 is adjusted narrow, the outer lines OL-6a, OL-6b, OL-6c, OL-7a, OL-7b, and OL-7c are not concentrated in a specific area, and thus interference between signals delivered through the outer lines OL-6a, OL-6b, OL-6c, OL-7a, OL-7b, and OL-7c may be minimized. FIGS. 7A to 7D are plan views of the side surface CF (see FIG. 5) of the display module DM according to some example embodiments, which is viewed in the first direction DR1.

Along the first direction DR1, the side surface CF of the display module DM may be formed with the outer lines OLa and OLb, the dummy patterns MPa, MPb, and MPc, and the input sensing unit ISU. In other words, the connection lines FL (see FIG. 5) or the electrostatic discharge circuit ESD (FIG. 6A) may not be exposed to the outside of the display panel DP due to the outer lines OLa and OLb and the dummy patterns MPa, MPb, and MPc.

The space between the outer lines OLa and OLb, the dummy patterns MPa, MPb, and MPc, and the input sensing unit ISU may be filled with the resin RS. The foregoing description with reference to FIG. 5 may be identically applied to the resin RS.

Figure 7A:
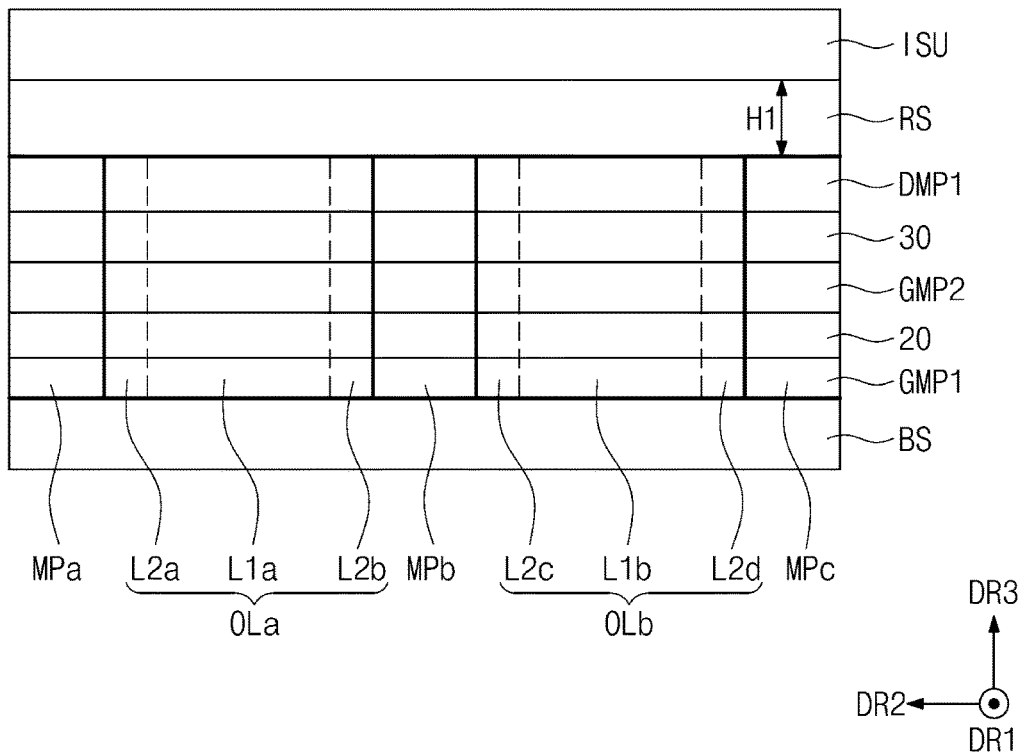
FIGS. 7A to 7D are cross-sectional views of a display module according to some example embodiments of the inventive concept.

Referring to FIG. 7A, the outer lines OLa and OLb according to some example embodiments may include at least one of the first conductive layer GMP1 to the third conductive layer DMP1. For example, the outer lines OLa and OLb may include the first conductive layer GMP1, the second insulation layer 20, the second conductive layer GMP2, the third insulation layer 30 and the third conductive layer DMP1.

The dummy patterns MPa, MPb, and MPc may include at least one of the first conductive layer GMP1 to the third conductive layer DMP1. For the efficiency of the process, according to some example embodiments, the outer lines OLa and OLb and the dummy patterns MPa, MPb, and MPc may have the same material or the same layer structure. For example, the dummy patterns MPa, MPb, and MPc may include the first conductive layer GMP1, the second insulation layer 20, the second conductive layer GMP2, the third insulation layer 30 and the third conductive layer DMP1.

However, the embodiments of the inventive concept are not limited thereto.

Figure 7B:
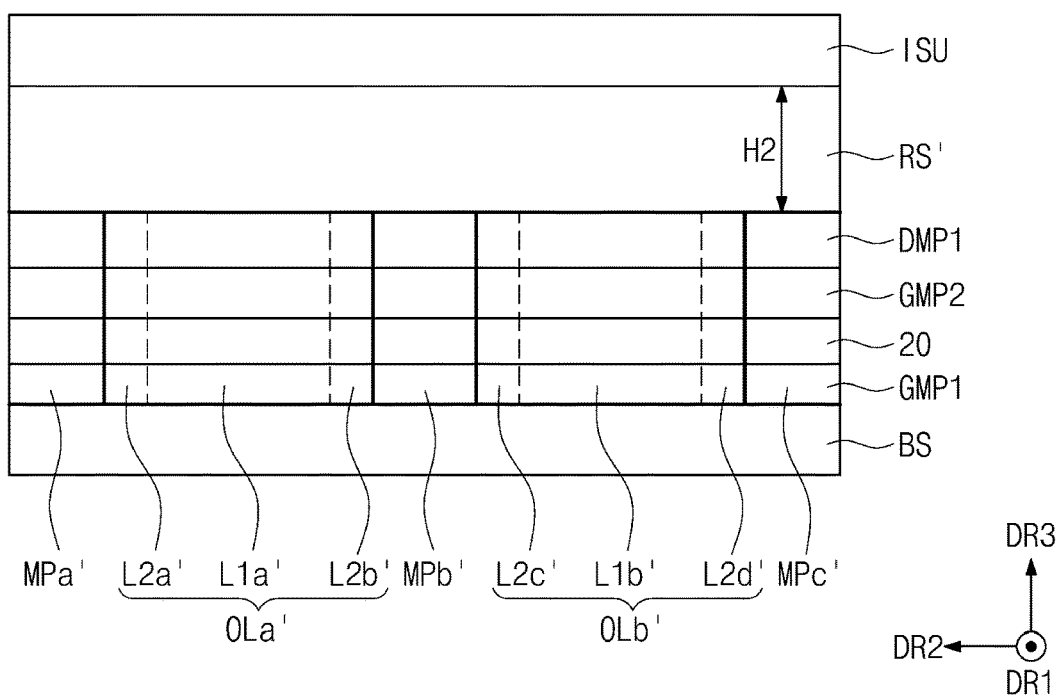

FIG. 7B illustrates that outer lines OLa' and OLb' according to some example embodiments may include the first conductive layer GMP1, the second insulation layer 20, the second conductive layer GMP2, and the third conductive layer DMP1. In other words, the outer lines OLa' and OLb' according to some example embodiments may not include the third insulation layer 30. In addition, the outer line Ola' and OLb' may include center lines L1a' and L1b', and branch lines L2a', L2b', L2c' and L2d'.

The dummy patterns MPa', MPb', and MPc according to some example embodiments may include at least one of the first conductive layer GMP1 to the third conductive layer DMP1. For example, the dummy patterns MPa', MPb', and MPc' may include the first conductive layer GMP1, the second insulation layer 20, the second conductive layer GMP2, and the third conductive layer DMP1. In other words, the dummy patterns MPa, MPb, and MPc according to some example embodiments may not include the third insulation layer 30.

As the outer lines OLa' and OLb' and the dummy patterns MPa', MPb', and MPc' according to some example embodiments do not include the third insulation layer 30, the height H2 of a resin RS' may be greater than that H1 of the resin RS in FIG. 7A.

Figure 7C:
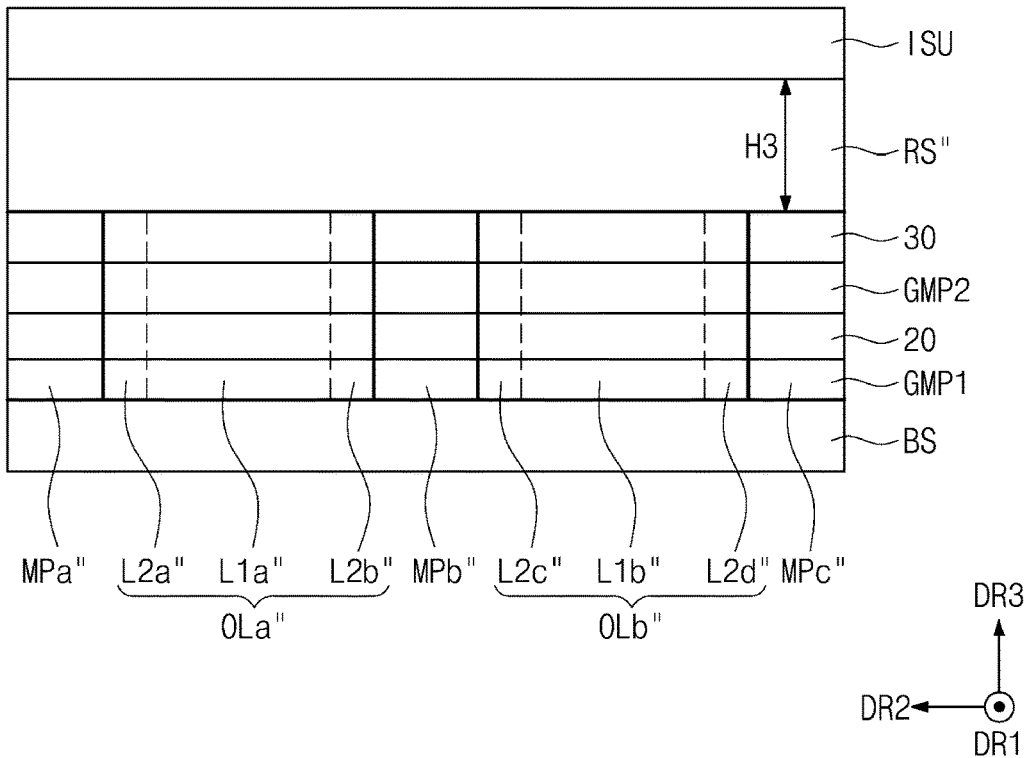

FIG. 7C illustrates that outer lines OLa" and OLb" according to some example embodiments may include the first conductive layer GMP1, the second insulation layer 20, the second conductive layer GMP2, and the third insulation layer 30. In other words, the outer lines OLa" and OLb" according to some example embodiments may not include the third conductive layer DMP1. In addition, the outer line OLa" and OLb" may include center lines L1a" and L1b", and branch lines L2a", L2b", L2c" and L2d".

Dummy patterns MPa", MPb", and MPc" according to some example embodiments may include at least one of the first conductive layer GMP1 and the second conductive layer GMP2. For example, the dummy patterns MPa", MPb", and MPc" may include the first conductive layer GMP1, the second insulation layer 20, the second conductive layer GMP2, and the third insulation layer 30. In other words, the dummy patterns MPa", MPb", and MPc" according to some example embodiments may not include the third conductive layer DMP1.

As the outer lines OLa" and OLb" and the dummy patterns MPa", MPb", and MPc" according to some example embodiments do not include the third conductive layer DMP1, the height H3 of a resin RS" may be greater than that H1 of the resin RS in FIG. 7A.

Figure 7D:
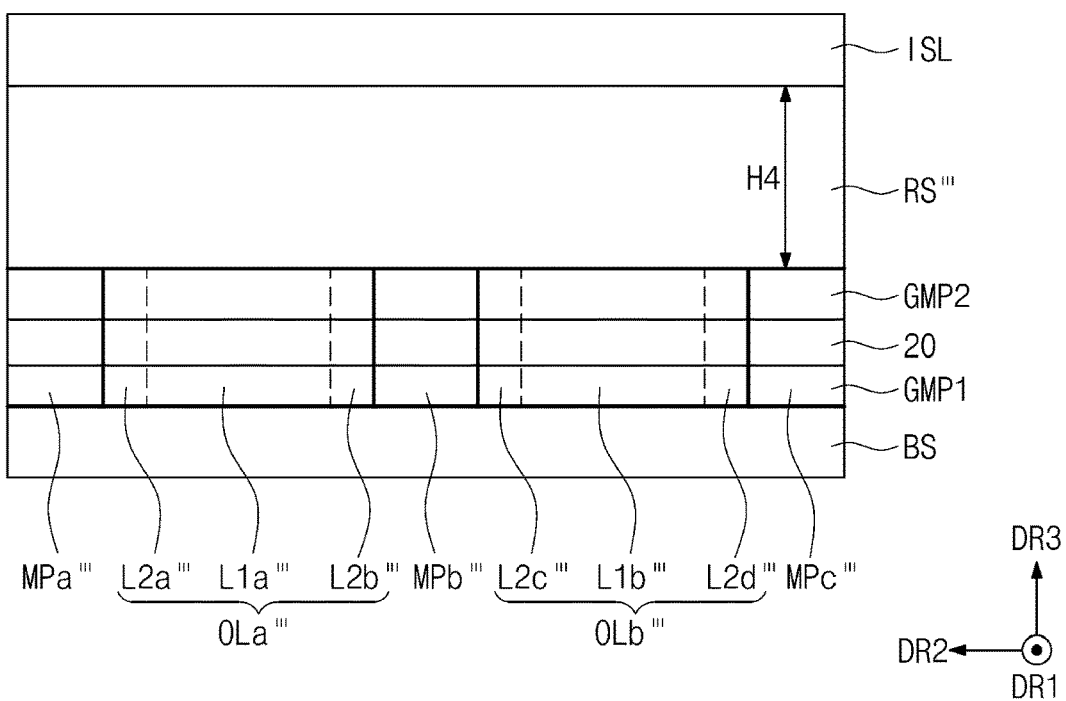

FIG. 7D illustrates that outer lines OLa''' and OLb''' according to some example embodiments may include the first conductive layer GMP1, the second insulation layer 20, and the second conductive layer GMP2. In other words, the outer lines OLa''' and OLb''' according to some example embodiments may not include the third insulation layer 30 and the third conductive layer DMP1. In addition, the outer line OLa''' and OLb''' may include center lines L1a''' and L1b''', and branch lines L2a''', L2b''', L2c''' and L2d'''.

Dummy patterns MPa''', MPb''', and MPc''' according to some example embodiments may include at least one of the first conductive layer GMP1 to the third conductive layer DMP1. For example, the dummy patterns MPa''', MPb''', and MPc''' may include the second conductive layer GMP2, the second insulation layer 20, and the second conductive layer GMP2. In other words, the dummy patterns MPa''', MPb''', and MPc'' according to some example embodiments may not include the third insulation layer 30 and the third conductive layer DMP1.

As the outer lines OLa''' and OLb''' and the dummy patterns MPa''', MPb''', and MPc''' according to some example embodiments do not include the third insulation layer 30 and the third conductive layer DMP1, the height H4 of a resin RS''' may be greater than those H1, H2, and H3 of the resins RS, RS' and RS" in FIGS. 7A to 7C. In other words, according to the number of the conductive layers or the insulation layers included in the outer lines OLa, OLa', OLa", and OLa''', the height of the resin RS, RS', RS", or RS''' may be adjusted.

Figure 8:
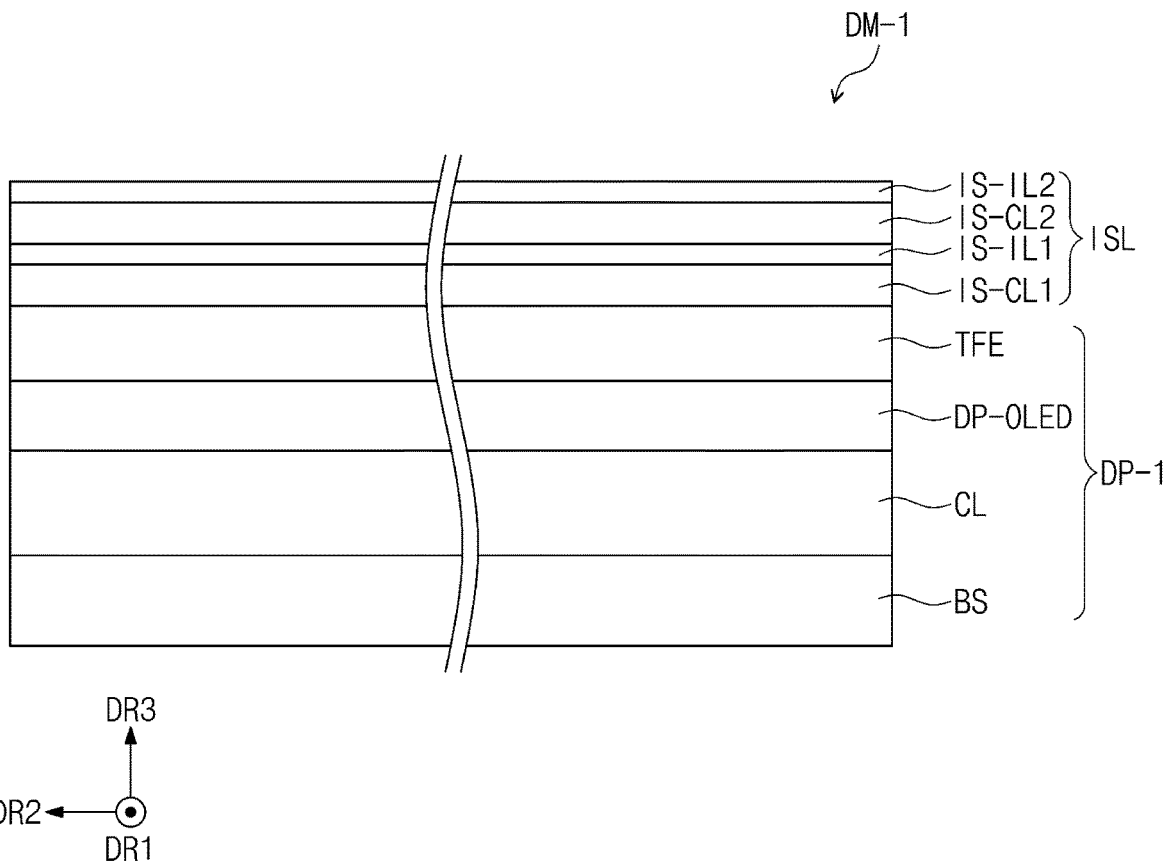
FIG. 8 is a cross-sectional view of a display module according to some example embodiments of the inventive concept.
Figure 9:
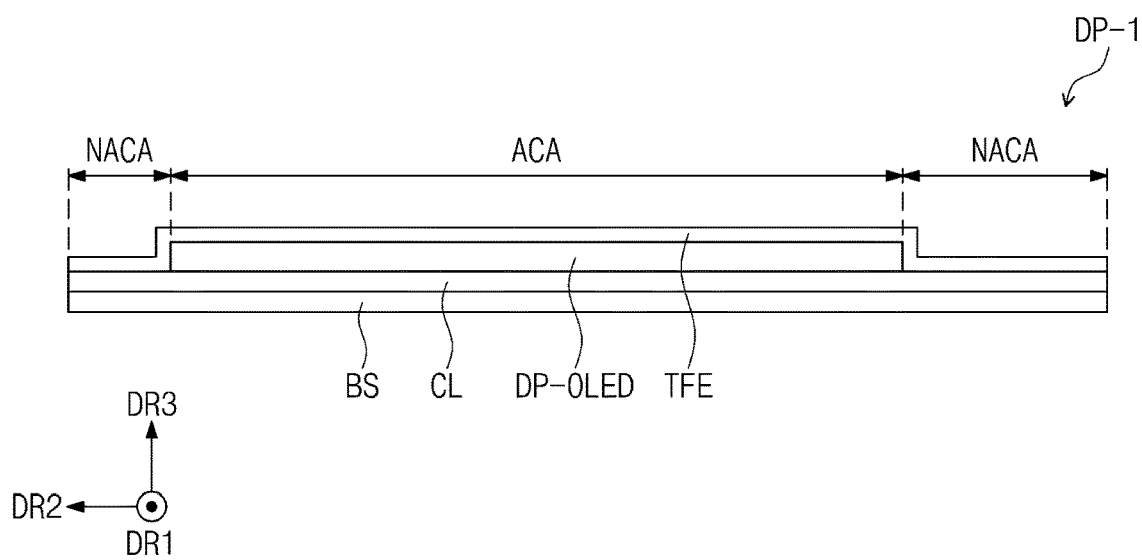
FIG. 9 is a cross-sectional view of a display panel according to some example embodiments of the inventive concept.

FIG. 8 is a cross-sectional view of a display module DM-1 according to some example embodiments of the inventive concept. FIG. 9 is a cross-sectional view of the display panel DP-1 according to some example embodiments of the inventive concept.

Referring to FIGS. 8 and 9, the display module DM-1 according to some example embodiments may include the display panel DP-1 and the input sensing unit ISU. The display panel DP-1 according to some example embodiments may include a thin film encapsulation layer TFE located on the light emitting element layer DP-OLED. The same description as the foregoing will be applied to components other than those components.

The thin film encapsulation layer TFE may be formed on the light emitting element layer DP-OLED to encapsulate the light emitting element layer DP-OLED. The thin film encapsulation layer TFE includes at least one insulation layer. The thin film encapsulation layer TFE according to some example embodiments of the inventive concept may include at least one inorganic film (hereinafter, an encapsulation inorganic film). The thin-film encapsulation layer TFE according to some example embodiments of the inventive concept may include at least one organic film (hereinafter, an encapsulation organic film). The thin-film encapsulation layer TFE according to some example embodiments of the inventive concept may include at least one encapsulation organic film and at least one encapsulation inorganic film.

The thin-film encapsulation layer TFE may overlap the entire surface of the active area ACA. At least a portion of the thin-film encapsulation layer TFE may overlap the non-active area NACA. The thin-film encapsulation layer TFE may be formed on the circuit layer CL overlapping the non-active area NACA. In other words, at least a portion of the thin-film encapsulation layer TFE and the circuit layer CL may overlap the non-active area NACA.

According to some example embodiments, the input sensing unit ISU may be an input sensing layer ISL. The input sensing layer ISL may be directly formed on the display panel DP-1. The input sensing layer ISL in the present embodiment may be manufactured through successive processes to the display panel DP. However, the embodiments of the inventive concept are not limited thereto.

The input sensing layer ISL may include a first input conductive layer IS-CL1, a first input insulation layer IS-IL1, a second input conductive layer IS-CL2, and a second input insulation layer IS-IL2. According to some example embodiments, an inorganic film may be additionally formed on the bottom portion of the first input conductive layer IS-CL1.

Each of the first input conductive layer IS-CL1 and the second input conductive layer IS-CL2 may include a metal layer or a transparent conductive layer. The metal layer may include molybdenum, silver, titanium, copper, aluminum, and an alloy thereof. The transparent conductive layer may include a transparent conductive oxide such as indium tin oxide (ITO), indium zinc oxide (IZO), zinc oxide ZnO, or indium tin zinc oxide (ITZO). Besides, the transparent conductive layer may include a conductive polymer such as PEDOT, a metal nano-wire, or graphene.

Each of the first input insulation layer IS-IL1 and the second input insulation layer IS-IL2 may include an inorganic material, an organic material, or a composite material. For example, the inorganic material may include aluminum oxide, titanium dioxide, silicon oxide, silicon oxynitride, or the like.

For example, the organic material may include an acrylic-based resin, a methacrylic-based resin, polyisoprene, a vinyl-based resin, an epoxy-based resin, an urethane-based resin, a cellulose-based resin, a siloxane-based resin, a polyimide-based resin, a polyamide-base resin, a perylene-based resin, or the like.

According to some example embodiments, the first input conductive layer IS-CL1 may be patterned on the thin film encapsulation layer TFE. The first input conductive layer IS-CL1 may be directly patterned on the thin film encapsulation layer TFE or directly formed on the inorganic film located on the thin film encapsulation layer TFE.

The first input insulation layer IS-IL1 covering the first input conductive layer IS-CL1 may be formed on the first input conductive layer IS-CL1. The second input conductive layer IS-CL2 may be patterned on the first input insulation layer IS-IL1. The second input insulation layer IS-IL2 covering the second input conductive layer IS-CL2 may be formed on the second input conductive layer IS-CL2.

However, the embodiments of the inventive concept are not limited thereto, and the input sensing unit ISU may be combined with the display panel through an adhesive layer on an encapsulation substrate.

In the display device according to some example embodiments of the present disclosure, damage to signal lines located adjacent to a pad located on a side surface of the display panel may be minimized, reduced, or prevented in the manufacturing process.

While this invention has been described with reference to example embodiments thereof, it will be clear to those of ordinary skill in the art to which the invention pertains that various changes and modifications may be made to the described embodiments without departing from the spirit and technical area of the invention as defined in the appended claims and their equivalents.

Thus, the scope of the inventive concept shall not be restricted or limited by the foregoing description, but be determined by the broadest permissible interpretation of the following claims and their equivalents.

What is claimed is:

1. A display device comprising:
    a base layer comprising a top surface, a bottom surface opposite to the top surface, and a plurality of side surfaces connecting the top surface and the bottom surface, wherein a display area and a non-display area adjacent to the display area are defined;
    an outer line overlapping the non-display area, on the top surface, and adjacent to any one of the plurality of side surfaces;
    a light emitting element layer overlapping the display area, on the top surface, and comprising a light emitting element; and
    a connection line connecting the outer line and the light emitting element,
    wherein the outer line comprises a center line extending from the connection line in a first direction and a branch line extending from the center line in a second direction crossing the first direction,
    wherein the outer line is provided in plural, and
    the display device further comprises a dummy pattern between a plurality of center lines.

2. The display device of claim 1, wherein the dummy pattern overlaps at least a portion of the outer line.

3. The display device of claim 1, wherein the connection line overlaps at least one of the outer line or the dummy pattern.

4. The display device of claim 1, wherein a shape of the dummy pattern comprises at least one of a circle or a polygon.

5. The display device of claim 1, further comprising:
    an electrostatic discharge circuit on the base layer,
    wherein the electrostatic discharge circuit overlaps at least one of the outer line or the dummy pattern in the first direction.

6. The display device of claim 1,
    wherein the outer line comprises neighboring first and second outer lines,
    wherein the first outer line comprises a first center line and a first branch line, and
    the second outer line comprises a second center line and a second branch line,
    wherein the first branch line and the second branch line overlap each other in the first direction.

7. The display device of claim 1, further comprising:
a plurality of pads on any one of the plurality of side surfaces and configured to contact the outer line.

8. The display device of claim 7, further comprising:
a circuit board electrically connected to the plurality of pads.

9. The display device of claim 8, wherein the circuit board is a flexible circuit board.

10. The display device of claim 1, wherein a shape of the branch line comprises at least one of a circle or a polygon.

11. The display device of claim 1, further comprising:
a first insulation layer, a first conductive layer, a second insulation layer, a second conductive layer, a third insulation layer, a third conductive layer, and a fourth insulation layer sequentially laminated on the base layer.

12. The display device of claim 11, further comprising:
a transistor on the base layer and electrically connected to the light emitting element; and
a connection electrode electrically connected to the transistor,
wherein the transistor comprises a source, a drain, and an active channel under the first insulation layer, and a gate between the first insulation layer and the second insulation layer, and
the connection electrode is between any two contacting insulation layers among the first insulation layer, the second insulation layer, the third insulation layer, and the fourth insulation layer.

13. The display device of claim 11, wherein the outer line comprises at least one of the first conductive layer, the second conductive layer, or the third conductive layer.

14. The display device of claim 1, wherein the outer line comprises one or a plurality of layers.

15. The display device of claim 1, wherein the top surface of the base layer comprises a long side and a short side, and the outer line is adjacent to the long side or the short side.

16. The display device of claim 1, wherein a width of the center line is greater than that of the connection line.

17. The display device of claim 1, wherein the base layer comprises a flexible material.

18. A display device comprising:
a display panel comprising a base layer, a circuit layer, and a light emitting element layer sequentially laminated; and
a plurality of pads on a side surface of the display panel,
wherein the circuit layer comprises:
an outer line on the base layer;
a connection line connecting the outer line and the light emitting element layer; and
an electrostatic discharge circuit on the base layer,
wherein the outer line is closer to the side surface than the electrostatic discharge circuit,
entire surfaces of the connection line and the electrostatic discharge circuit overlap the outer line, and
the outer line contacts the plurality of pads.

19. The display device of claim 18, wherein the outer line further comprises:
a center line extending from the connection line in a first direction; and
at least one of a branch line extending from the center line in a second direction crossing the first direction or a dummy pattern adjacent to the center line.

* * * * *